United States Patent
Kim

(10) Patent No.: US 11,531,606 B2
(45) Date of Patent: Dec. 20, 2022

(54) MEMORY APPARATUS CAPABLE OF AUTONOMOUSLY DETECTING AND REPAIRING FAIL WORD LINE AND MEMORY SYSTEM INCLUDING THE SAME

(71) Applicant: SK hynix Inc., Gyeonggi-do (KR)

(72) Inventor: Hyung Sup Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 140 days.

(21) Appl. No.: 17/031,485

(22) Filed: Sep. 24, 2020

(65) Prior Publication Data

US 2021/0311842 A1   Oct. 7, 2021

(30) Foreign Application Priority Data

Apr. 7, 2020  (KR) .................. 10-2020-0042100

(51) Int. Cl.
*G06F 11/20* (2006.01)
*G06F 9/4401* (2018.01)
*G11C 11/408* (2006.01)

(52) U.S. Cl.
CPC ........ *G06F 11/2094* (2013.01); *G06F 9/4401* (2013.01); *G11C 11/4085* (2013.01); *G06F 2201/85* (2013.01)

(58) Field of Classification Search
CPC . G06F 11/2094; G06F 9/4401; G11C 11/4085
USPC ......................................... 714/6.1, 6.11, 6.13
See application file for complete search history.

(56) References Cited

U.S. PATENT DOCUMENTS

| | | | |
|---|---|---|---|
| 5,774,471 A * | 6/1998 | Jiang .................... | G11C 29/808 714/711 |
| 2016/0118139 A1* | 4/2016 | Shim ..................... | G11C 29/76 365/96 |
| 2017/0040066 A1* | 2/2017 | Kim ....................... | G11C 29/24 |
| 2019/0198113 A1* | 6/2019 | Ben-Rubi ............. | G06F 3/0679 |
| 2019/0287641 A1* | 9/2019 | Ko ......................... | G11C 29/838 |

FOREIGN PATENT DOCUMENTS

| KR | 10-2015-0051420 | 5/2015 |
|---|---|---|
| KR | 10-1862379 | 7/2018 |

* cited by examiner

*Primary Examiner* — Chae M Ko
(74) *Attorney, Agent, or Firm* — IP & T Group LLP

(57) ABSTRACT

A memory apparatus comprising: a cell array comprising multiple first and second word lines, a fuse array configured to substitute a selection word line of the multiple first word lines with the multiple second word lines, a fail determination unit configured to determine, as a fail word line, a word line matched with a first condition during an access operation for the multiple first word lines and to determine a fail grade of the fail word line based on a second condition, an information storage unit configured to store a physical address, fail grade and access count of the fail word line as determination information for the fail word line, and a rupture operation unit configured to select the selection word line from the fail word lines based on a result of the analysis of the determination information, and perform rupturing the selection word line into the fuse array.

20 Claims, 9 Drawing Sheets

FIG. 4

|  | PHYSICAL ADDRESS | ACCESS COUNT | GRADE |
|---|---|---|---|
| S1 | ADDRESS<2> | ACCESS_COUNT<2> | GRADE3 |
| S2 | EMPTY | EMPTY | GRADE3 |
| S3 | EMPTY | EMPTY | GRADE3 |
| S4 | ADDRESS<1> | ACCESS_COUNT<1> | GRADE2 |
| S5 | EMPTY | EMPTY | GRADE2 |
| S6 | EMPTY | EMPTY | GRADE2 |
| S7 | EMPTY | EMPTY | GRADE2 |
| S8 | EMPTY | EMPTY | GRADE2 |
| S9 | ADDRESS<0> | ACCESS_COUNT<0> | GRADE1 |
| S10 | ADDRESS<3> | ACCESS_COUNT<3> | GRADE1 |
| S11 | ADDRESS<4> | ACCESS_COUNT<4> | GRADE1 |
| S12 | EMPTY | EMPTY | GRADE1 |
| S13 | EMPTY | EMPTY | GRADE1 |
| S14 | EMPTY | EMPTY | GRADE1 |

14 or 34 or 44

MEMORY APPARATUS CAPABLE OF AUTONOMOUSLY DETECTING AND REPAIRING FAIL WORD LINE AND MEMORY SYSTEM INCLUDING THE SAME

CROSS-REFERENCE TO RELATED APPLICATION

This application claims priority under 35 U.S.C. § 119 to Korean Patent Application No. 10-2020-0042100, filed on Apr. 7, 2020, which is incorporated herein by reference in its entirety.

BACKGROUND

1. Field

Various embodiments relate to a semiconductor design technology, and particularly, to a memory apparatus capable of autonomously detecting and repairing a fail word line and a memory system including the memory apparatus.

2. Discussion of the Related Art

The memory capacity of a semiconductor memory apparatus, for example, a dynamic random access memory (DRAM) has increased with further development of manufacturing process technology. As micro-process technology progresses, the number of memory cells that fail (fail memory cells) also increases. Fail memory cells may include defect cells and weak cells. A defect cell means a cell that is defective in terms of hardware, and refers to a cell that does not operate properly due to a defect in a manufacturing process, for example, a memory cell within which a wiring is disconnected or short-circuited. A weak cell means a cell that is detective in terms of software, and refers to a memory cell that becomes defective under a specific voltage condition or a memory cell that becomes defective at specific operating timing while using of the apparatus. A weak cell may include a cell exhibiting degradation in various types of device characteristics, for example, a cell having a short refresh time and a cell exhibiting cell write characteristic degradation or a variable retention time.

In order to secure appropriate yield, fail memory cells within a semiconductor memory apparatus need to be repaired by replaced them with redundancy memory cells. To this end, the semiconductor memory apparatus may include a fuse circuit for changing an internal configuration or programming a repair address. A fuse in the fuse circuit stores an address and specific configuration information through a fuse programming task. If a laser beam or electrical stress is applied to the fuse, an electric resistance value of the fuse varies due to a change in the electrical connection characteristic of the fuse. Specific information may be programmed using a change in the electrical connection state of the fuse, that is, short-circuiting or opening of the fuse.

For reference, in general, a laser blowing type fuse whose connection state is disconnected using a laser beam is called a physical fuse type. Such disconnection may be basically performed in a wafer state, that is, a step performed before a semiconductor memory apparatus is fabricated in a package form. In the state in which a semiconductor memory apparatus has been fabricated in a package form, an electrical method may be used instead of a physical method using a laser. A fuse that may be programmed in the state in which a semiconductor memory apparatus has been fabricated in a package form is commonly called a fuse using an electrical method (i.e., electrical fuse). This means that a fuse can be programmed by changing the electrical connection state of the fuse by applying electrical stress. A fuse using the electrical method may be an anti-type fuse whose open state is changed into a short state or a blowing type fuse whose short state is changed into an open state. Fuses using such several methods may be selectively used by taking the characteristics or area of a semiconductor memory apparatus into consideration.

Conventionally, an external test apparatus is necessary in order to input various test patterns (or codes, data) for a repair test on a semiconductor memory apparatus. In the step of producing a semiconductor memory apparatus, a repair operation may be performed on the semiconductor memory apparatus using the external test device without any problem as described above. However, after the semiconductor memory apparatus is produced and mounted, an error may occur over time, that is, as the semiconductor memory apparatus is repeatedly used. For this reason, there is a need for a configuration capable of performing a repair operation even after a semiconductor memory apparatus is mounted, in addition to performing repair during the production stage, in the semiconductor memory apparatus.

SUMMARY

Various embodiments are directed to a memory apparatus capable of autonomously detecting a fail word line and controlling whether to perform a repair operation based on the detecting result, and a memory system including the memory apparatus.

In an embodiment, a memory apparatus may include: a cell array comprising multiple first word lines each including multiple first memory cells and multiple second word lines each including multiple second memory cells; a fuse array configured to replace a selection word line of the multiple first word lines with one of the multiple second word lines; a fail determiner configured to determine, as fail word lines, word lines each of which satisfy a first condition during an access operation for the multiple first word lines and to determine a fail grade of each of the fail word lines based on a second condition; an information storage configured to store a physical address, fail grade and access count of each of the fail word lines as determination information for the corresponding fail word line; and a rupture operation component configured to analyze the determination information, select the selection word line from the fail word lines based on a result of the analysis, and perform a rupture operation of rupturing a physical address of the selection word line into the fuse array.

The fail determiner may be configured to: determine, as the fail word lines, word lines each having an error of 1 bit or more during the access operation for the multiple first word lines, classify, as a first fail grade, a word line having an error of less than N bits among the fail word lines, classify, as a second fail grade, a word line having an error of the N bits or more and less than M bits among the fail word lines, and classify, as a third fail grade, a word line having an error of the M bits or more among the fail word lines. N may be a natural number of 2 or more and M may be a natural number greater than N.

The rupture operation component may be configured to: analyze the determination information, and select, as the selection word line, one of the fail word line of the first fail grade and having an access count exceeding a set count and the fail word lines of the second and third fail grades.

The rupture operation component may be configured to: analyze the determination information, output an urgent rupture signal when the number of fail word lines of the third fail grade is one or more or the number of fail word lines of the second fail grade and having the access count exceeding the set count is one or more, and perform the rupture operation when a permission response to the urgent rupture signal is received.

The rupture operation component may be configured to: analyze the determination information, output an urgent rupture signal when a sum of the number of fail word lines of the second fail grade and having an access count of the set count or less and the number of fail word lines of the first fail grade and having an access count exceeding the set count exceeds a reference number, and perform the rupture operation when a permission response to the urgent rupture signal is received.

The rupture operation component may be configured to: analyze the determination information, and be scheduled to perform the rupture operation after entering a set time period, when the sum is the reference number or less, or when a permission response to the urgent rupture signal is not received after outputting an urgent rupture signal.

The urgent rupture signal may request holding access to the memory apparatus.

The urgent rupture signal may request re-booting of the memory apparatus.

The set time period may be a time during a booting operation is performed.

The cell array may include multiple third memory cells, and the information storage may be configured to store the addresses of the fail word lines in the multiple third memory cells.

In an embodiment, a memory system may include: multiple memory apparatuses coupled to each other, and an information analyzer, each of the multiple memory apparatuses may include: a cell array comprising multiple first word lines each including multiple first memory cells and multiple second word lines each including multiple second memory cells; a fuse array configured to replace a selection word line of the multiple first word lines with one of the multiple second word lines; a fail determiner configured to determine, as fail word lines, word lines, each of which satisfy a first condition, during an access operation for the multiple first word lines and to determine a fail grade of each of the fail word lines based on a second condition; an information storage configured to store a physical address, fail grade and access count of each of the fail word line as determination information for the corresponding fail word line; and a rupture operation component configured to perform a selection operation of selecting the selection word line from the fail word lines in response to a first control signal of the information analyzer and perform a rupture operation of rupturing a physical address of the selection word line into the fuse array in response to a second control signal of the information analyzer. The information analyzer may be configured to analyze the determination information stored in the information storage of each of the multiple memory apparatuses and to generate the first and second control signals based on a result of the analysis.

The fail determiner may be configured to: determine, as the fail word lines, word lines having an error of 1 bit or more during the access operation for the multiple first word lines, classify, as a first fail grade, a word line having an error of less than N bits among the fail word lines, classify, as a second fail grade, a word line having an error of the N bits or more and less than M bits among the fail word lines, and classify, as a third fail grade, a word line having an error of the M bits or more among the fail word lines. N may be a natural number of 2 or more and M may be a natural number greater than N.

The information analyzer may be configured to: analyze the determination information stored in the information storage of each of the multiple memory apparatuses, and generate the first control signal so that the rupture operation component in each of the multiple memory apparatuses performs the selection operation of selecting, as the selection word line, one of the fail word line of the first fail grade and having an access count exceeding a set count and the fail word lines of the second and third fail grades.

The information analyzer may be configured to: in the selection operation performed by the rupture operation component, included in each of at least K memory apparatuses of the multiple memory apparatuses, in response to the first control signal, when the fail word line of the third fail grade is selected as the selection word line or when the fail word line of the second fail grade and having an access count exceeding the set count is selected as the selection word line, output an urgent rupture signal to a host, and generate the second control signal so that the rupture operation component, included in each of the multiple memory apparatuses, performs the rupture operation when a permission response to the urgent rupture signal is received from the host. K may be a natural number of 2 or more.

The information analyzer may be configured to: in the selection operations performed by all the rupture operation components in the multiple memory apparatuses in response to the first control signal, when a sum of the number of times that the rupture operation components have selected, as the selection word line, the fail word line of the second fail grade and having an access count of the set count or less and the number of times that the rupture operation components have selected, as the selection word line, the fail word line of the first fail grade and having an access count exceeding the set count exceeds a reference number, output an urgent rupture signal to the host, and generate the second control signal so that the rupture operation component in each of the multiple memory apparatuses performs the rupture operation when a permission response to the urgent rupture signal is received from the host.

The information analyzer may be configured to: generate the second control signal so that the rupture operation component in each of the multiple memory apparatuses performs the rupture operation after entering a set time period, when the sum is the reference number or less or when a permission response to an urgent rupture signal is not received from the host after outputting the urgent rupture signal to the host.

The urgent rupture signal may include a signal to request holding access to the multiple memory apparatuses from the host.

The urgent rupture signal may request a re-booting of the multiple memory apparatuses from the host.

The set time period may be a time during which a booting operation is performed.

The cell array may include multiple third memory cells, and the information storage may be configured to store the addresses of the fail word lines in the multiple third memory cells.

In an embodiment, a memory apparatus may include: a cell array including a first group of memory cells coupled to a first group of word lines and a second group of memory cells coupled to a second group of word lines; a fuse array configured to substitute one of the word lines in the second group of word lines for a selection word line of the multiple first word lines; a fail determiner configured to determine fail word lines among the first group of word lines and to determine a fail grade of each of the fail word lines; and a rupture operation component configured to select the selection word line among the fail word lines based on the fail grade and rupture a physical address of the selection word line into the fuse array such that the selection word line is replaced with one of the second group of word lines.

BRIEF DESCRIPTION OF THE DRAWINGS

FIG. 4 illustrates a detailed configuration of an information storage.

DETAILED DESCRIPTION

Figure 1A:
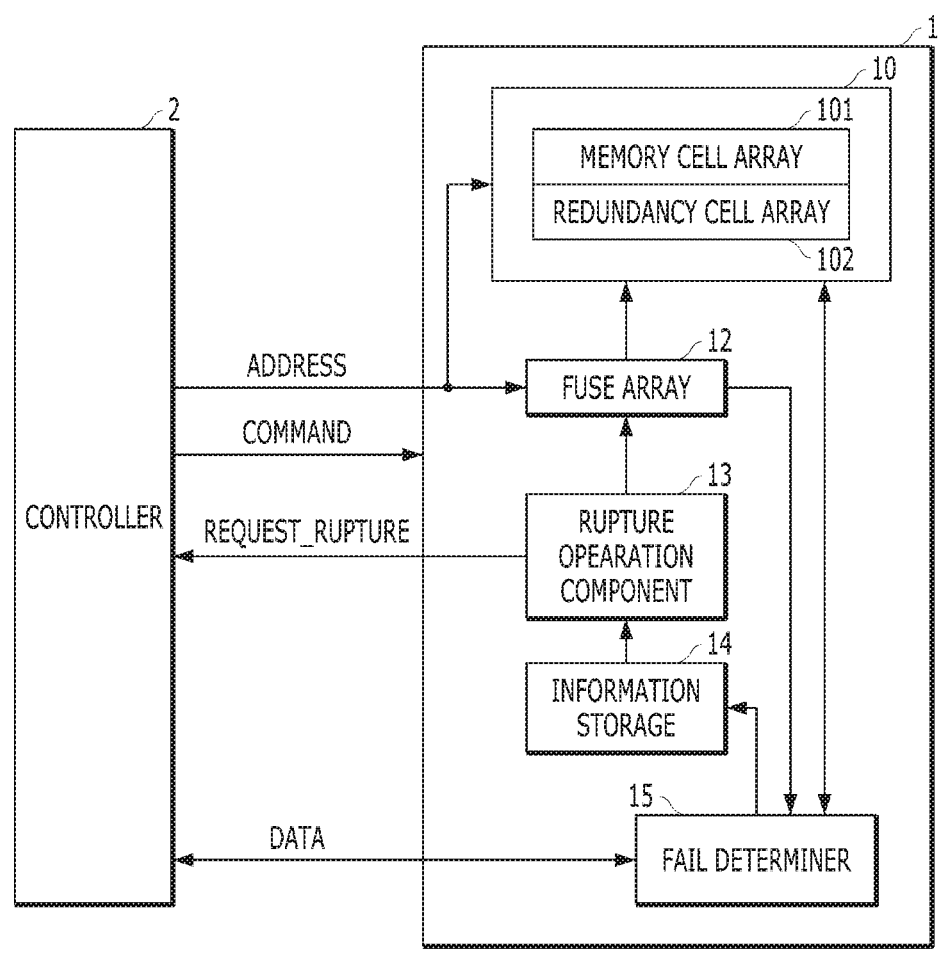
FIGS. 1A and 1B illustrate examples of a semiconductor memory apparatus according to a first embodiment.

Various examples of the disclosure are described below in more detail with reference to the accompanying drawings. Aspects and features of the present invention, however, may be embodied in different ways to form other embodiments, including variations of any of the disclosed embodiments. Thus, the invention is not limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without indicating any change in the element itself.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Embodiments of the disclosure are described in detail below with reference to the accompanying drawings, wherein like numbers reference like elements.

First Embodiment

Figure 1B:
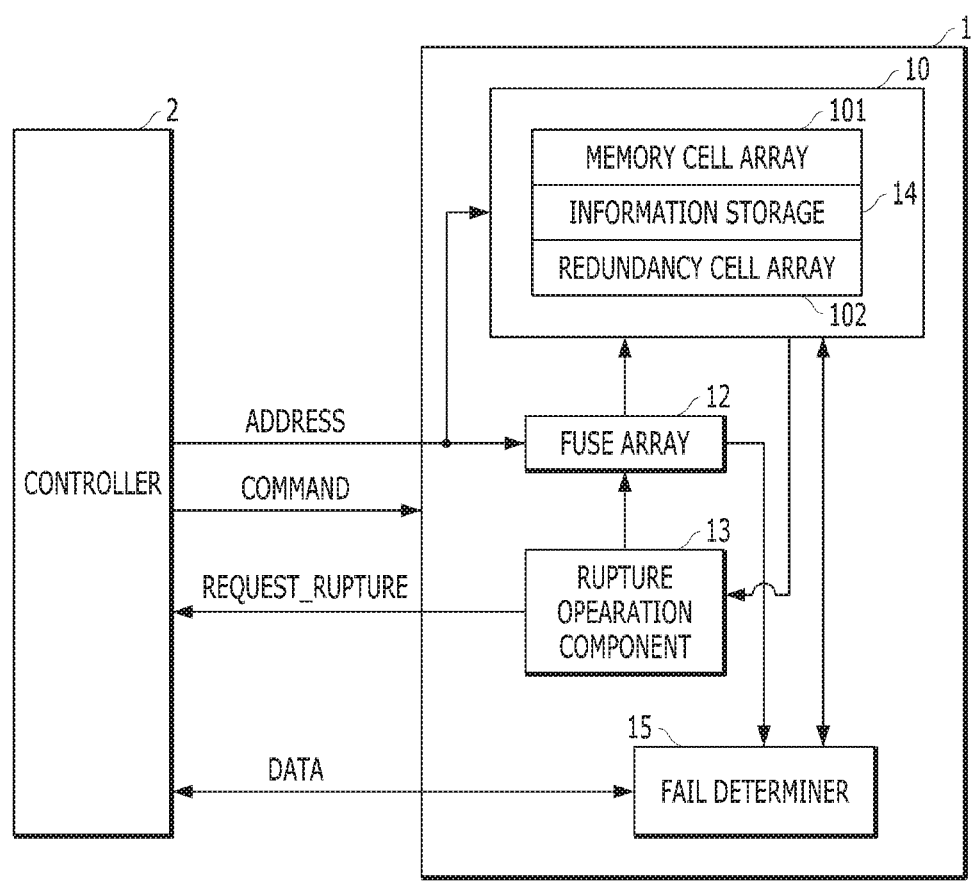

FIGS. 1A and 1B illustrate examples of a semiconductor memory apparatus 1 according to a first embodiment.

Referring to FIG. 1A, the semiconductor memory apparatus 1 may include a memory cell region 10, a fuse array 12, a rupture operation component 13, an information storage 14 and a fail determiner 15. The memory cell region 10 may include a memory cell array 101 and a redundancy cell array 102.

The semiconductor memory apparatus 1 may operate in response to a request COMMAND and/or ADDRESS from an external controller 2. That is, the semiconductor memory apparatus 1 may store, in the memory cell region 10, data DATA received through the controller 2, and may output, to the controller 2, data DATA stored in the memory cell region 10. In this case, the controller 2 may be an element for controlling an operation of the semiconductor memory apparatus 1 in response to a request from a user who uses the semiconductor memory apparatus 1.

The controller 2 may internally generate a command COMMAND, an address ADDRESS and data DATA, and may transmit them to the semiconductor memory apparatus 1. The semiconductor memory apparatus 1 may store, in the memory cell region 10, the data DATA received from the controller 2 or may output, to the controller 2, data DATA stored in the memory cell region 10, in response to the command COMMAND and the address ADDRESS. For reference, the semiconductor memory apparatus 1 may include control logic (not illustrated) for decoding the command COMMAND and controlling operations of other internal elements 10, 12, 13, 14, and 15.

The semiconductor memory apparatus 1 may be implemented as any of various volatile memory apparatuses, such as a dynamic random access memory (DRAM) and a static RAM (SRAM), and nonvolatile memory apparatuses, such as a read only memory (ROM), a mask ROM (MROM), a programmable ROM (PROM), an erasable PROM (EPROM), an electrically erasable PROM (EEPROM), a ferromagnetic ROM (FROM), a phase change RAM (PRAM), a magnetic RAM (MRAM), a resistive RAM (RRAM) and/or a flash memory.

The following description is based on the assumption that the semiconductor memory apparatus 1 is a DRAM. However, as noted above, the semiconductor memory apparatus 1 is not limited to a DRAM but may be a different type of memory.

Furthermore, the redundancy cell array 102 in the memory cell region 10 may include redundancy memory cells for repairing fail memory cells in the memory cell array 101.

Figure 3A:
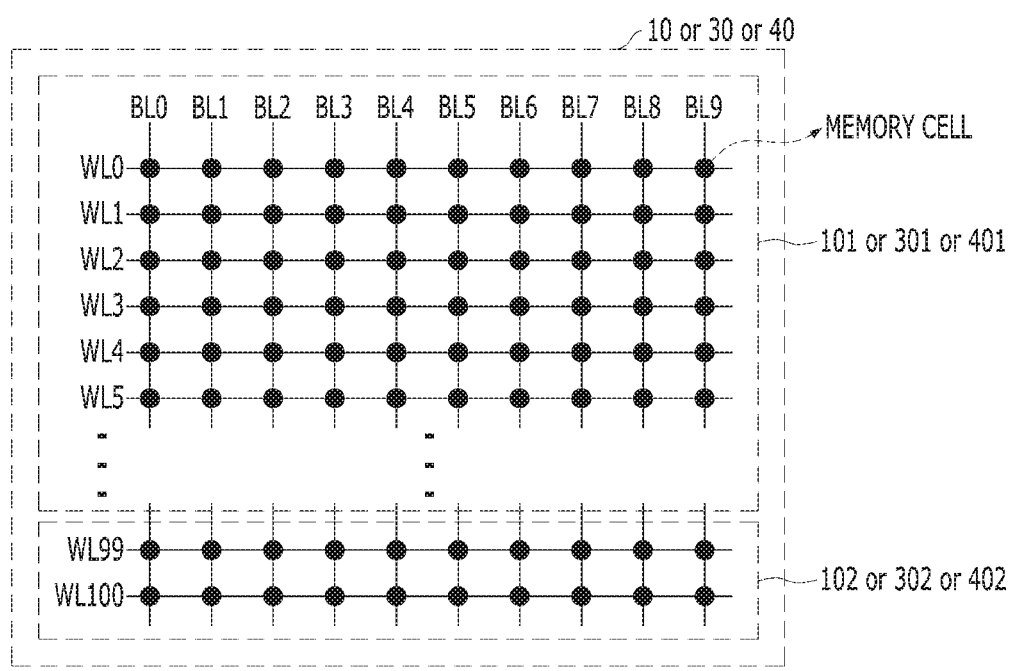
FIGS. 3A and 3B illustrate detailed configurations of a memory cell region.

Reference may be further made to FIG. 3A in order to describe a detailed configuration of the memory cell region 10.

Referring to FIGS. 1A and 3A together, the memory cell region may include multiple memory cells MEMORY CELL which are located at respective points where multiple word lines WL<0:100> and multiple bit lines BL<0:9> intersect in an array form and in which data of at least 1 bit may be stored. In this case, the semiconductor memory apparatus 1 may select any one of the multiple memory cells by selecting any one of the multiple word lines WL<0:100> and any one of the multiple bit lines BL<0:9> in response to an address ADDRESS, and may write or read data DATA in or from the selected memory cell.

Memory cells in first word lines WL<0:98>, of the entire set of word lines WL<0:100>, may be designated as the memory cell array 101. The remaining memory cells, i.e., those in second word lines WL<99:100>, may be designated as the redundancy cell array 102.

In this case, an operation of repairing a fail memory cell in the memory cell array 101 using a redundancy memory cell may be performed in a unit of a word line unit or a bit line. For example, as illustrated in FIG. 3A, if the redundancy cell array 102 has a form including the multiple word lines WL<99:100>, a word line that belongs to the first word lines WL<0:98> in the memory cell array 101 and that includes a fail memory cell may be repaired using the second word lines WL<99:100> in the redundancy cell array 102. Unlike the example illustrated in FIG. 3A, if the redundancy cell array 102 has a form including multiple bit lines, a bit line that belongs to bit lines in the memory cell array 101 and that includes a fail memory cell may be repaired using a bit line in the redundancy cell array 102. For reference, in the following embodiments of the present disclosure, a characteristic configuration and operation of the present disclosure are described based on an operation of performing a repair operation in a word line unit. However, this is merely an embodiment, and an operation of performing a repair operation in a bit line unit may be applied to a characteristic configuration and operation of the present disclosure depending on a designer's choice.

The fuse array 12 may include multiple fuses (not illustrated) operating according to the electrical method, and may substitute a second word line WL<99:100> in the redundancy cell array 102 for a selection word line of the first word lines WL<0:98>, in the memory cell array 101. That is, such second word line may be used in instead of the selection word line. For example, when an address ADDRESS corresponding to a selection word line of the first word lines WL<0:98> is input, the fuse array 12 may output a signal for selecting a second word line WL<99:100> that replaces the selection word line to the memory cell region 10. Accordingly, in response to the address ADDRESS, the second word lines WL<99:100> may be selected instead of the selection word line in the first word lines WL<0:98>. Furthermore, when an address ADDRESS corresponding to another word line, not a selection word line, among the first word lines WL<0:98> is input, the fuse array 12 may output the input address ADDRESS to the memory cell region 10 without any change. Accordingly, in response to the address ADDRESS, another word line, not the selection word line, in the first word lines WL<0:98>, may be selected. That is, the fuse array 12 may determine whether an address corresponding to a selection word line of the first word lines WL<0:98> has been internally ruptured and whether an input address ADDRESS is an address corresponding to the selection word line through an operation of comparing the input address ADDRESS with the ruptured address within the fuse array 12.

The fail determiner 15 may determine, as a fail word line, a word line that satisfies a first condition during an access operation for the first word lines WL<0:98> in the memory cell array 101 of the memory cell region 10, and may determine a fail grade of the fail word line based on a second condition.

Specifically, the fail determiner 15 may determine, as a fail word line, a word line having one or more error bits during an access operation for the first word lines WL<0:98> in the memory cell array 101 of the memory cell region 10. That is, the first condition of the fail determiner 15 may be whether an error of 1 bit or more has occurred. Among the fail word lines, the fail determiner 15 may classify, as a first fail grade, a fail word line that has an error of less than N bits, classify, as a second fail grade, a fail word line that has an error of the N bits or more and less than M bits, and classify, as a third fail grade, a failed word line that has an error of M bits or more. In this case, N may be a natural number of 2 or more, and M may be a natural number greater than N. That is, the second condition of the fail determiner 15 may be how many errors have occurred in a fail word line.

For example, while an access operation is performed on word lines WL<0:10> of the first word lines WL<0:98>, an error of 1 bit may occur in each of word lines WL0, WL3 and WL4, an error of 2 bits may occur in word line WL1, an error of 3 bits may occur in word line WL2, and no error may occur in each of word lines WL<5:10>. When N is 2 and M is 3, for example, the fail determiner 15 may determine word lines WL<0:4> as fail word lines and may not make any determination for word lines WL<5:10>. Furthermore, the fail determiner 15 may classify, as a first fail grade, each of word lines WL0, WL3 and WL4, may classify, as a second fail grade, WL1, and may classify, as a third fail grade, word line WL2.

As described above, the fail determiner 15 may differently classify fail grades of word lines based on how many errors have occurred in the corresponding word lines on which an access operation will be performed.

For reference, the fail determiner 15 may use any known and suitable error detection method, such as a parity bit, a checksum, or a cyclic redundancy check (CRC), in order to detect an error in an access operation for a word line.

Furthermore, with respect to a fail word line, the information storage 14 may store a physical address thereof, a fail grade thereof, and an access count thereof, as determination information for the fail word line. That is, whenever determining a fail word line, the fail determiner 15 may store a physical address, fail grade and access count of the determined fail word line in the information storage 14.

Reference may be further made to FIG. 4 in order to describe a detailed configuration of the information storage 14.

Referring to FIGS. 1A, 3A and 4 together, the information storage 14 may store a physical address PHYSICAL ADDRESS for a fail word line determined by the fail determiner 15. It may be seen that the fail grade GRADE, access count ACCESS COUNT and physical address PHYSICAL ADDRESS of a fail word line are stored in association and linked to the fail word line.

For example, the information storage 14 may include spaces S<1:14> in which the physical addresses PHYSICAL ADDRESS, fail grades GRADE and access counts ACCESS COUNT of 14 fail word lines may be stored. In this case, the information storage 14 may be partitioned as follows. The three spaces S<1:3> of the 14 spaces S<1:14> may be reserved to store determination information of word lines classified as a third fail grade GRADE3 by the fail determiner 15, the five spaces S<4:8> of the 14 spaces S<1:14> may be reserved to store determination information of word lines classified as a second fail grade GRADE2 by the fail determiner 15, and the six spaces S<9:14> of the 14 spaces S<1:14> may be reserved to store determination information of word lines classified as a first fail grade GRADE1.

In such a state, it may be assumed that the fail determiner 15 classifies each of word lines WL0, WL3 and WL4 as the first fail grade, classifies word line WL1 as the second fail grade, and classifies word line WL2 as the third fail grade.

In such a case, an access count value ACCESS_COUNT<2> of word line WL2, together with a physical address ADDRESS<2> thereof, may be stored in the first space S1 among the three spaces S<1:3>, reserved for the third fail grade, in the information storage 14. Furthermore, an access count value ACCESS_COUNT<1> of word line WL1, together with a physical address ADDRESS<1> thereof, may be stored in the first space S4 among the five spaces S<4:8>, reserved for the second fail grade, in the information storage 14. Furthermore, an access count value ACCESS_COUNT<0> of word line WL0, together with a physical address ADDRESS<0> thereof, may be stored in the first space S9 among the six spaces S<9:14>, reserved for the first fail grade, in the information storage 14. An access count value ACCESS_COUNT<3> of word line WL3, together with a physical address ADDRESS<3> thereof, may be stored in the second space S10 among the six spaces S<9:14> in the information storage 14. An access count value ACCESS_COUNT<4> of word line WL4, together with a physical address ADDRESS<4> thereof, may be stored in the third space S11 among the six spaces S<9:14> in the information storage 14.

For reference, in the aforementioned description, an access count value of a specific word line may mean the number of times that the specific word line has been accessed at the time at which the physical address PHYSICAL ADDRESS of the specific word line is stored in the information storage 14. For example, the semiconductor memory apparatus 1 may include counter logic (not illustrated) for managing the access counts of multiple word lines WL<0:100>, separately from an operation of storing the physical address PHYSICAL ADDRESS of a specific word line in the information storage 14. Accordingly, an access count of a specific word line of the multiple word lines WL<0:100> and that is managed by the counter logic may be stored in the information storage 14 at the time at which the physical address PHYSICAL ADDRESS of the specific word line is stored. For reference, the counter logic may be a part of the control logic for decoding a command COMMAND within the semiconductor memory apparatus 1 and controlling operations of other internal elements 10, 12, 13, 14, and 15.

The information storage 14 stores determination information for a fail word line, and thus may be implemented as a register or a memory device, such as an SRAM or a DRAM, which is physically separate from the memory cell region 10. That is, as illustrated in FIG. 1A, the information storage 14 may be disposed in the semiconductor memory apparatus 1 separately from the memory cell region 10. Accordingly, determination information for a fail word line determined by the fail determiner 15, that is, a physical address PHYSICAL ADDRESS, a fail grade GRADE, and an access count value ACCESS COUNT, may be output from the fail determiner 15 and stored in the information storage unit 14.

Alternatively, unlike the example illustrated in FIG. 1A, the information storage 14 may be included in the semiconductor memory apparatus 1 such that the information storage 14 is allocated some regions of the memory cell region 10.

Figure 3B:
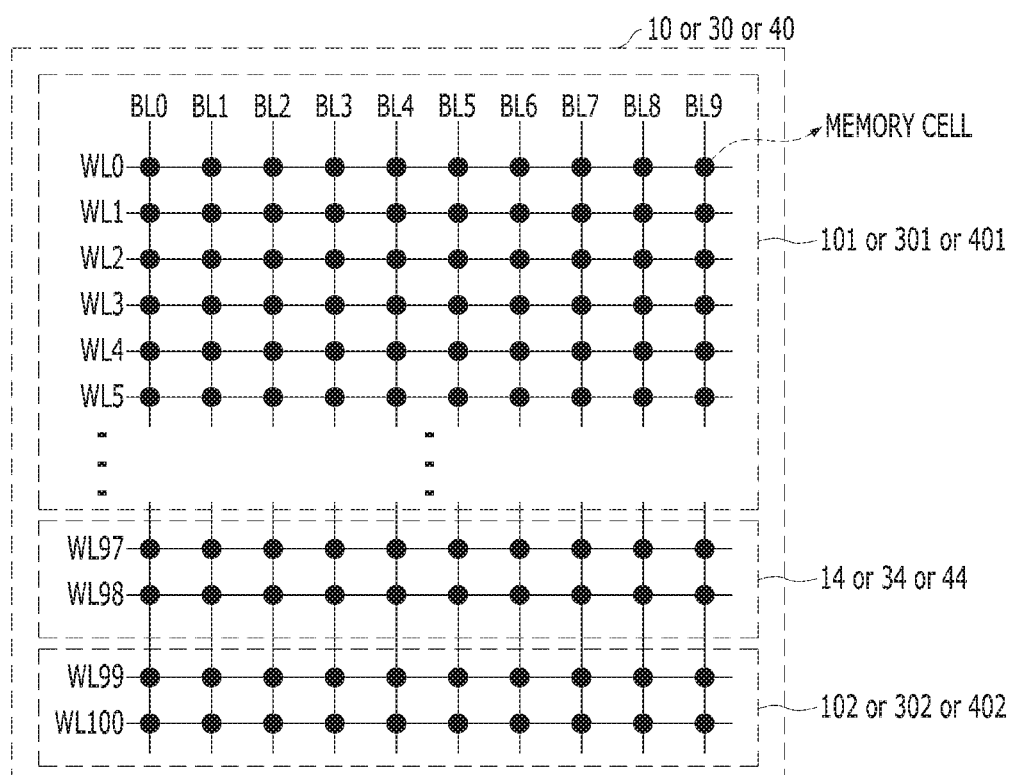

Referring to FIGS. 1B and 3B together, the memory cell region may include the memory cell array 101, the redundancy cell array 102, and a cell region for the information storage 14. That is, memory cells in the memory cell region 10 that are included in the first word lines WL<0:96> may be classified as the memory cell array 101, memory cells in the second word lines WL<99:100> may be classified as the redundancy cell array 102, and memory cells in the third word lines WL<97:98> may be classified as a cell region for the information storage 14. If the information storage 14 is embodied in the memory cell region 10 as described above, determination information for a fail word line determined by the fail determiner 15, that is, a physical address PHYSICAL ADDRESS, a fail grade GRADE, and an access count value ACCESS COUNT, may be output from the fail determiner 15 and stored in the information storage 14 of the memory cell region 10.

The rupture operation component 13 may analyze determination information for fail word lines stored in the information storage 14, that is, physical addresses PHYSICAL ADDRESS, fail grades GRADE, and access count values ACCESS COUNT. Further, the rupture operation component 13 may select a word line (selection word line) from the fail word lines based on a result of the analysis. Furthermore, the rupture operation component 13 may perform a rupture operation of rupturing the physical address of the selection word line into the fuse array 12. That is, the rupture operation component 13 may rupture the physical addresses of only selection word lines determined by the fail determiner 15 into the fuse array 12.

Specifically, the rupture operation component 13 may analyze determination information stored in the information storage 14, and may select, as a selection word line, a fail word line corresponding to the first fail grade GRADE1 and having an access count ACCESS COUNT exceeding a set count, among fail word lines. In contrast, the rupture operation component 13 may analyze determination information stored in the information storage 14, and may not select, as a selection word line, a fail word line corresponding to the first fail grade GRADE1, but having an access count ACCESS COUNT of a set count or less, among fail word lines. Furthermore, the rupture operation component 13 may analyze determination information stored in the information storage 14, and may select, as a selection word line, a fail word line corresponding to the second fail grade GRADE2 and the third fail grade GRADE3, among fail word lines.

For example, it may be assumed that in the information storage 14, a physical address ADDRESS<2> and an access count value ACCESS_COUNT<2> of word line WL2 are stored in the first space S1 indicating the third fail grade, a physical address ADDRESS<1> and an access count value ACCESS_COUNT<1> of word line WL1 are stored in the first space S4 indicating the second fail grade, and physical addresses ADDRESS<0>, ADDRESS<3>, and ADDRESS<4> and access count values ACCESS_COUNT<0>, ACCESS_COUNT<3>, and ACCESS_COUNT<4> of the word lines WL0, WL3, and WL4 are respectively stored in the first to third spaces S9, S10, and S11 each indicating the first fail grade. Furthermore, it may be assumed that each of the access count values ACCESS_COUNT<3> and ACCESS_COUNT<4> of word lines WL3 and WL4 of word lines WL0, WL3, and WL4 exceeds a set count and the access count value ACCESS_ COUNT<0> of word line WL0 is the set count or less. In such a case, the rupture operation component 13 may select word lines WL1, WL2, WL3, and WL4 as selection word lines, and may not select word line WL0 as a selection word line.

Furthermore, the rupture operation component 13 may perform a rupture operation of rupturing the physical address of a selection word line into the fuse array 12. However, when access to the semiconductor memory apparatus 1 occurs in the time period in which the rupture operation component 13 performs the rupture operation, a normal rupture operation of the rupture operation component 13 cannot be ensured. The reason for this may be that a very high voltage is used to rupture a new physical address into the fuse array 12 because such operation involves changing the electrical connection state of a fuse, in the fuse array 12, by applying electrical stress to the fuse. Furthermore, as described above, an address ADDRESS received from the controller 2 is transmitted to the memory cell region 10 via the fuse array 12. In this case, the normal operation thereof cannot be ensured because the fuse array 12 cannot operate properly while a new physical address is ruptured into the fuse array 12.

Accordingly, the time at which the rupture operation component 13 performs a rupture operation may be determined based on the following conditions.

According to a first condition, the rupture operation component 13 may analyze determination information stored in the information storage 14. When the number of fail word lines each corresponding to the third fail grade GRADE3 is one or more based on a result of the analysis, the rupture operation component 13 may output an urgent rupture signal REQUEST_RUPTURE to the controller 2. Thereafter, when a permission response to the urgent rupture signal REQUEST_RUPTURE is received from the controller 2, the rupture operation component 13 may start the execution of a rupture operation. For example, when the physical address of at least one fail word line is stored in the three spaces S<1:3>, reserved for the third fail grade, in the information storage 14, the rupture operation component 13 may output an urgent rupture signal REQUEST_RUPTURE to the controller 2 regardless of the number of physical addresses of fail word lines which are stored in the 11 spaces S<4:14> reserved for the remaining second and first fail grades. Next, when a permission response to the urgent rupture signal REQUEST_RUPTURE is received from the controller 2, the rupture operation component 13 may start the execution of a rupture operation at the time at which the permission response is input.

According to a second condition, the rupture operation component 13 may analyze determination information stored in the information storage 14. When the number of fail word lines each corresponding to the second fail grade GRADE2 and having an access count exceeding a set count is one or more based on a result of the analysis, the rupture operation component 13 may output an urgent rupture signal REQUEST_RUPTURE to the controller 2. Thereafter, when a permission response to the urgent rupture signal REQUEST_RUPTURE is received from the controller 2, the rupture operation component 13 may start the execution of a rupture operation. For example, in the state in which a fail physical address has not been stored in the three spaces S<1:3>, reserved for the third fail grade, in the information storage 14, when at least one fail physical address, having an access count value ACCESS COUNT exceeding a set count value, among fail physical addresses stored in the five spaces S<4:8> reserved for the second fail grade is present, the rupture operation component 13 may output an urgent rupture signal REQUEST_RUPTURE to the controller 2 regardless of how many fail physical addresses are stored in the six spaces S<9:14> reserved for the first fail grade. Next, when a permission response to the urgent rupture signal REQUEST_RUPTURE is received from the controller 2, the rupture operation component 13 may start the execution of a rupture operation at the time at which the permission response is received.

According to a third condition, the rupture operation component 13 may analyze determination information stored in the information storage 14. When the sum of the number of fail word lines, each corresponding to the second fail grade GRADE2 and having an access count of a set count or less, and the number of fail word lines, each corresponding to the first fail grade GRADE1 and having an access count exceeding a set count, exceeds a reference number based on a result of the analysis, the rupture operation component 13 may output an urgent rupture signal REQUEST_RUPTURE to the controller 2. Thereafter, when a permission response to the urgent rupture signal REQUEST_RUPTURE is received from the controller 2, the rupture operation component 13 may start the execution of a rupture operation. For example, in the state in which a fail physical address has not been stored in the three spaces S<1:3>, reserved for the third fail grade, in the information storage 14, when the sum of the number of fail physical addresses, each having an access count value ACCESS COUNT of a set count value or less, among fail physical addresses stored in the five spaces S<4:8> reserved for the second fail grade and the number of fail physical addresses, each having an access count value ACCESS COUNT exceeding a set count value, among fail physical addresses stored in the six spaces S<9:14> reserved for the first fail grade exceeds a reference number, the rupture operation component 13 may output an urgent rupture signal REQUEST_RUPTURE to the controller 2. Next, when a permission response to the urgent rupture signal REQUEST_RUPTURE is received from the controller 2, the rupture operation component 13 may start the execution of a rupture operation at the time at which the permission response is received.

According to a fourth condition, the rupture operation component 13 may analyze determination information stored in the information storage 14. When the sum of the number of fail word lines corresponding to the second fail grade GRADE2 and having an access count of a set count or less and the number of fail word lines corresponding to the first fail grade GRADE1 and having an access count exceeding a set count is a reference number or less based on a result of the analysis, the rupture operation component 13 may be scheduled to perform a rupture operation after entering a set time period. For example, in the state in which a fail physical address has not been stored in the three spaces S<1:3>, reserved for the third fail grade, in the information storage unit 14, when the sum of the number of fail physical addresses, each having an access count value ACCESS COUNT of a set count value or less, among fail physical addresses stored in the five spaces S<4:8> reserved for the second fail grade, and the number of fail physical addresses, each having an access count value ACCESS COUNT exceeding a set count value, among fail physical addresses stored in the six spaces S<9:14> reserved for the first fail grade is the reference number or less, the rupture operation component 13 may be scheduled to not output an urgent rupture signal REQUEST_RUPTURE to the controller 2 but perform a rupture operation after entering a set time period.

According to a fifth condition, if a permission response to an urgent rupture signal REQUEST_RUPTURE is not received from the controller 2 after the rupture operation component 13 outputs the urgent rupture signal REQUEST_RUPTURE to the controller 2 in the first to third conditions, the rupture operation component 13 may be scheduled to perform a rupture operation after entering a set time period.

In this case, the set time period may be the time during which the semiconductor memory apparatus 1 performs a booting operation. Accordingly, in the fourth and fifth conditions, the operation of the rupture operation component 13 scheduled to be performed after entering the set time period may be an operation scheduled to be performed after the semiconductor memory apparatus 1 starts a booting operation.

Furthermore, the urgent rupture signal REQUEST_RUPTURE may request that access to the semiconductor memory apparatus 1 by the controller 2 be held, i.e., temporarily prevented. That is, when the rupture operation component 13 generates an urgent rupture signal REQUEST_RUPTURE and transmits it to the controller 2, the controller 2 may determine whether to hold an access operation for the semiconductor memory apparatus 1. If the controller 2 can permit holding (or temporarily preventing) an access operation for the semiconductor memory apparatus 1, the controller 2 may transmit a permission response to the semiconductor memory apparatus 1. In contrast, if the controller 2 cannot permit that the access operation for the semiconductor memory apparatus 1 be held, the controller 2 may not transmit a permission response to the semiconductor memory apparatus 1 or may transmit a rejection response.

The urgent rupture signal REQUEST_RUPTURE may request re-booting of the semiconductor memory apparatus 1. That is, when the rupture operation component 13 generates an urgent rupture signal REQUEST_RUPTURE and transmits it to the controller 2, the controller 2 may determine whether to re-boot the semiconductor memory apparatus 1. If the controller 2 can permit the re-booting of the semiconductor memory apparatus 1, the controller 2 may transmit a permission response to the semiconductor memory apparatus 1. In contrast, if the controller 2 cannot permit the re-booting of the semiconductor memory apparatus 1, the controller 2 may not transmit a permission response to the semiconductor memory apparatus 1 or may transmit a rejection response.

In this case, if the controller 2 can permit the holding of an access operation for, or re-booting of, the semiconductor memory apparatus 1, this may mean that the controller 2 has notified a user or host using the semiconductor memory apparatus 1 that the semiconductor memory apparatus 1 cannot be used for a relatively short period of time, that is, during the time when access to the semiconductor memory apparatus 1 is held or the time taken for the semiconductor memory apparatus 1 to be re-booted, and has received a permission from the user or host.

If the controller 2 can permit the holding of an access operation for, or re-booting of, the semiconductor memory apparatus 1, this may mean that the controller 2 can store data requested by a user or host using the semiconductor memory apparatus 1 for a relatively short period of time because a buffer (not illustrated) capable of temporarily storing data is included in the controller 2, that is, during the time when access to the semiconductor memory apparatus 1 is held or the time taken for the semiconductor memory apparatus 1 to be re-booted.

In some embodiments, how the urgent rupture signal REQUEST_RUPTURE is transmitted from the semiconductor memory apparatus 1 to the controller 2 and how the permission response or rejection response is transmitted from the controller 2 to the semiconductor memory apparatus 1 may be performed using a designer-set method for communication between the controller 2 and the semiconductor memory apparatus 1. For example, the urgent rupture signal REQUEST_RUPTURE may be transmitted to the controller 2 along with a signal indicative of a result of a command operation, that is, an execution success or an execution failure, after the semiconductor memory apparatus 1 performs the command operation in response to a command COMMAND received from the controller 2. Furthermore, the permission response or rejection response from the controller 2 may be transmitted to the semiconductor memory apparatus 1 in the form of a command COMMAND.

In the first embodiment of the present disclosure as described above, when detecting whether a fail word line is present and corresponding information is stored in the information storage 14, the fail determiner 15 may determine and store a fail grade GRADE of the fail word line. In this case, if the fail word line has a low fail grade GRADE, the rupture operation component 13 may not select the fail word line as a selection word line, thus preventing a repair operation from being too frequently performed.

If a fail word line having a very high fail grade GRADE is present, the rupture operation component 13 may generate an urgent rupture signal REQUEST_RUPTURE and output it to a device or component external to the semiconductor memory apparatus 1 in order to perform a repair operation as soon as possible. Accordingly, a probability that an error may occur due to an access operation for a fail word line having a very high fail grade GRADE may be minimized.

Second Embodiment

Figure 2A:
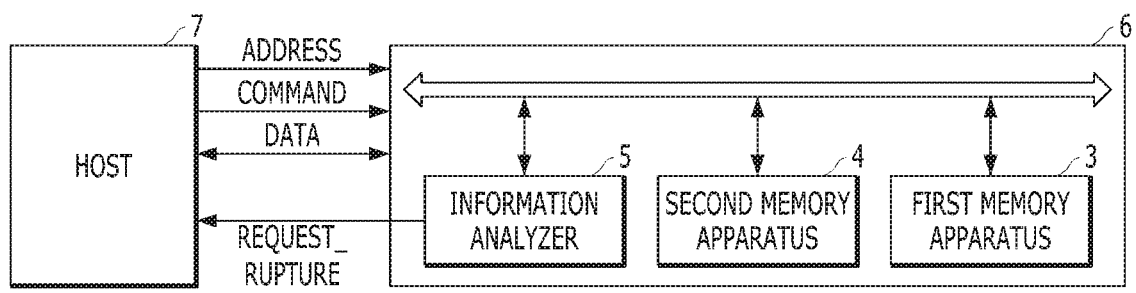
FIGS. 2A to 2C illustrate examples of a semiconductor memory system according to a second embodiment.
Figure 2B:
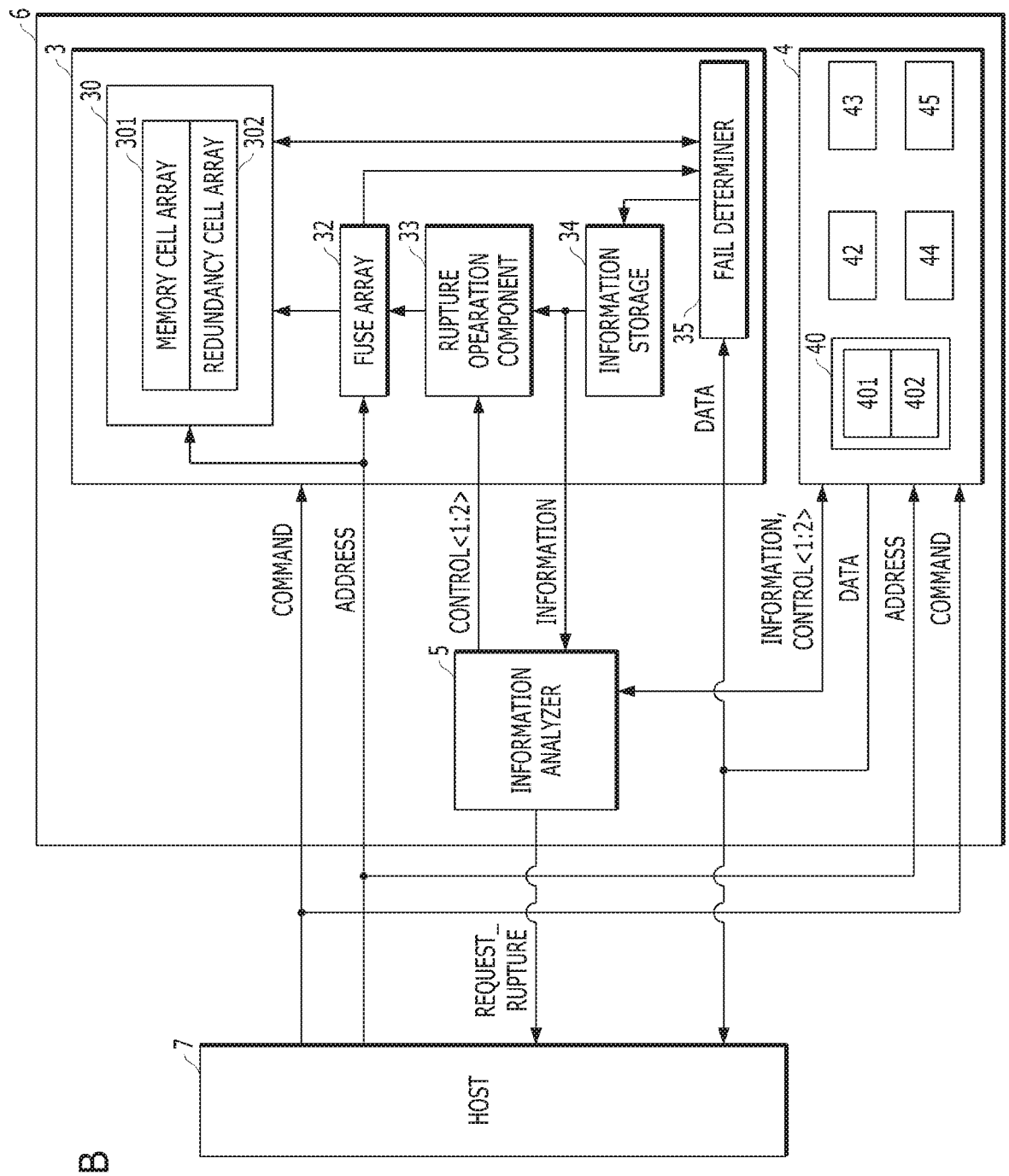
Figure 2C:
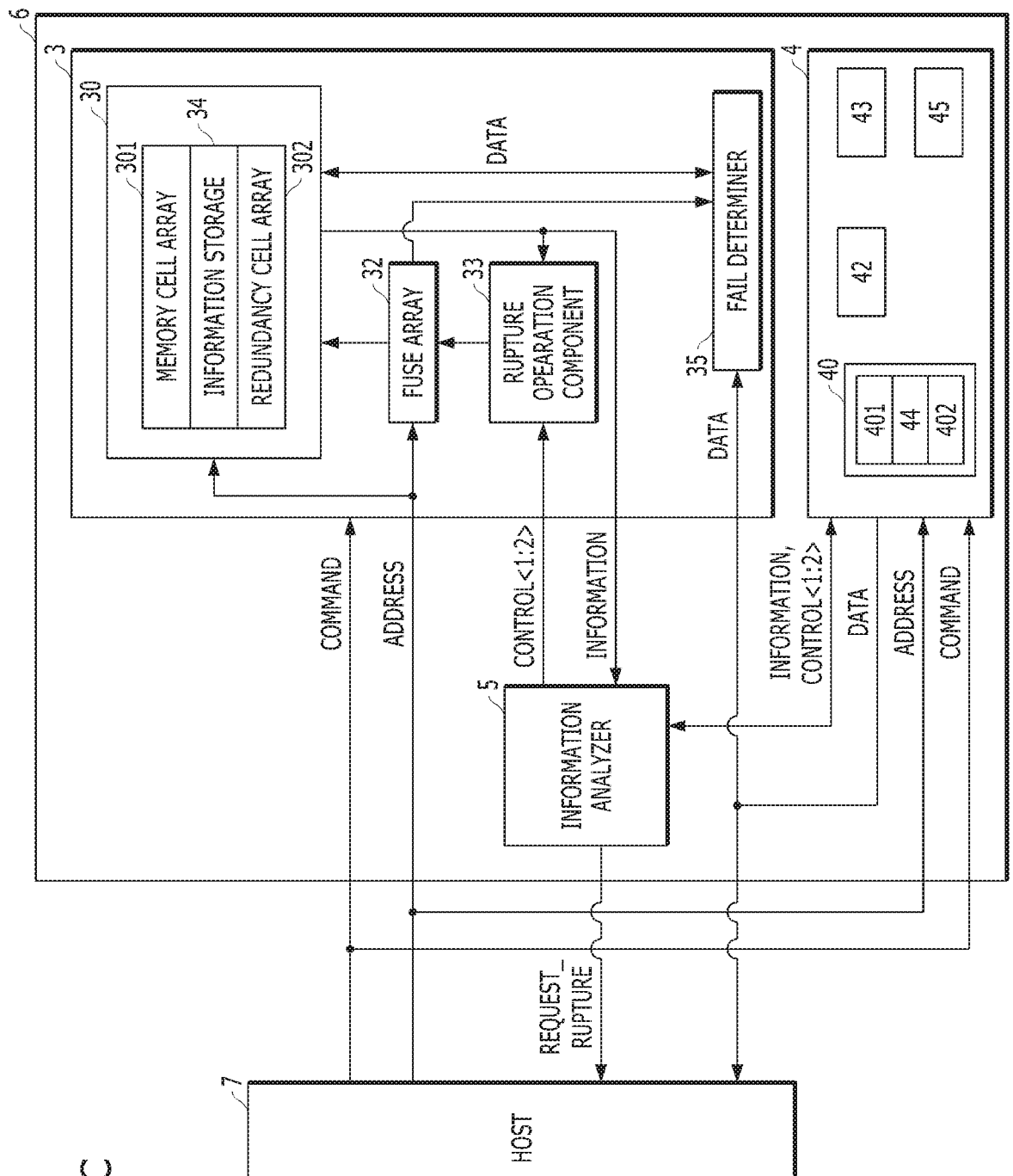

FIGS. 2A to 2C illustrate examples of a semiconductor memory system 6 according to a second embodiment.

First, referring to FIG. 2A, the semiconductor memory system 6 may include multiple semiconductor memory apparatuses 3 and 4, and an information analyzer 5.

Specifically, the semiconductor memory system 6 may operate in response to a request COMMAND or ADDRESS from a host 7. That is, the semiconductor memory system 6 may store, in the multiple semiconductor memory apparatuses 3 and 4, data DATA transmitted by the host 7, and may output, to the host 7, data DATA stored in the multiple semiconductor memory apparatuses 3 and 4.

The host 7 may include, for example, any of various portable electronic devices, such as a mobile phone, an MP3 player and/or a laptop computer, or electronic devices, such as a desktop computer, a game machine, TV and/or a projector. That is, the host 7 may be any suitable type of wired or wireless electronic device.

The host 7 includes at least one operating system (OS). The OS generally manages and controls the functions and operations of the host 7, and provides mutual operations between the host 7 and a user who uses the semiconductor memory system 6. In this case, the OS supports a function and operation corresponding to a use purpose and utilization of the user. For example, the OS may be divided into a common OS and a mobile OS based on the mobility of the host 7. The common OS may be divided into a personal OS and a business OS depending on a use environment of a user. For example, the personal OS is a system specialized to support a service provision function for a common user, and may include Windows and Chrome. The business OS is a system specialized to secure and support high performance, and may include Windows Server, Linux and Unix. The mobile OS is a system specialized to support a mobility service provision function and a power reduction function of the system for users, and may include Android, iOS, and Windows Mobile. In this case, the host 7 may include multiple OSs, and may execute an OS in order to perform an operation corresponding to a user request along with the semiconductor memory system 6. In this case, the host 7 may transmit, to the semiconductor memory system 6, to multiple commands COMMAND corresponding to the user request. Accordingly, the semiconductor memory system 6 may perform operations corresponding to the commands COMMAND, that is, operations corresponding to the user request.

The semiconductor memory system 6 operates in response to a request COMMAND or ADDRESS from the host 7. In particular, the semiconductor memory system 6 may store data DATA accessed by the host 7. In other words, the semiconductor memory system 6 may be used as a main storage apparatus or auxiliary storage apparatus of the host 7. In this case, the semiconductor memory system 6 may be implemented as any of various types of storage apparatuses based on a host interface protocol connected to the host 7. For example, the semiconductor memory system 6 may be implemented as a multi-media card (MMC) of a solid state drive (SSD), MMC, embedded MMC (eMMC), reduced size MMC (RS-MMC) or micro-MMC form, a secure digital (SD) card of an SD, mini-SD or micro-SD form, a universal serial bus (USB) storage apparatus, a universal flash storage (UFS) apparatus, a compact flash (CF) card, a smart media card, a memory stick, a dual in-line memory module (DIMM), and/or a non-volatile dual in-line memory module (NVDIMM).

A storage apparatus implementing the semiconductor memory system 6, that is, the semiconductor memory apparatus 3 or 4, may be implemented as any of various volatile memory apparatuses such as a dynamic random access memory (DRAM) and a static RAM (SRAM) and nonvolatile memory apparatuses, such as a read only memory (ROM), a mask ROM (MROM), a programmable ROM (PROM), an erasable PROM (EPROM), an electrically erasable PROM (EEPROM), a ferromagnetic ROM (FROM), a phase change RAM (PRAM), a magnetic RAM (MRAM), a resistive RAM (RRAM), and/or a flash memory.

The following description is based on the assumption that the multiple semiconductor memory apparatuses 3 and 4 are implemented as DRAMs. Alternatively, as noted above, each of the multiple semiconductor memory apparatuses 3 and 4 may be implemented with a type of memory different than a DRAM.

Reference may be further made to FIG. 2B in order to describe detailed configurations of the multiple semiconductor memory apparatuses 3 and 4.

FIGS. 2A and 2B illustrate a connection relation between the first memory apparatus 3 and the information analyzer 5 and a detailed configuration of the first memory apparatus 3 of the multiple semiconductor memory apparatuses 3 and 4 in the memory system 6.

Specifically, the first memory apparatus 3 may include a memory cell region 30, a fuse array 32, a rupture operation component 33, an information storage 34 and a fail determiner 35. In this case, the memory cell region 30 may include a memory cell array 301 and a redundancy cell array 302.

Although not directly illustrated in the drawings, the configuration of the second memory apparatus 4 may be the same or substantially the same as that of the first memory apparatus 3. That is, the second memory apparatus 4 may include a memory cell region 40, a fuse array 42, a rupture operation component 43, an information storage 44 and a fail determiner 45. Furthermore, the memory cell region 40 in the second memory apparatus 4 may include a memory cell array 401 and a redundancy cell array 402.

The first memory apparatus 3 may store data DATA in the memory cell region 30 or output, to the host 7, data DATA stored in the memory cell region 30, in response to a command COMMAND and address ADDRESS received from the host 7. The first memory apparatus 3 may include control logic (not illustrated) for decoding a command COMMAND and controlling operations of other internal elements 30, 32, 33, 34, and 35. Likewise, the second memory apparatus 4 may store data DATA in the memory cell region 40 or output, to the host 7, data DATA stored in the memory cell region 40, in response to a command COMMAND and address ADDRESS received from the host 7. The second memory apparatus 4 may include control logic (not illustrated) for decoding a command COMMAND and controlling operations of other internal elements 40, 42, 43, 44, and 45.

The redundancy cell arrays 302 and 402 in the memory cell regions 30 and 40, respectively, may include redundancy memory cells for repairing fail memory cells in the memory cell arrays 301 and 401.

Reference may be further made to FIG. 3A in order to describe detailed configurations of the memory cell regions 30 and 40.

Referring to FIGS. 2A, 2B and 3A together, each of the memory cell regions 30 and 40 of the respective first and second memory apparatuses 3 and 4 may include multiple memory cells MEMORY CELL which are located at respective points where multiple word lines WL<0:100> and multiple bit lines BL<0:9> intersect in an array form and in which data of at least 1 bit may be stored. In this case, the first and second memory apparatuses 3 and 4 may select any one of the multiple memory cells by selecting any one of the multiple word lines WL<0:100> and any one of the multiple bit lines BL<0:9> in response to an address ADDRESS, and may write or read data DATA in or from the selected memory cell.

Memory cells in first word lines WL<0:98> of the multiple word lines WL<0:100> in each of the memory cell regions 30 and 40 of the respective first and second memory apparatuses 3 and 4 may be classified as the memory cell arrays 301 and 401. Memory cells in the second word lines WL<99:100> of the multiple word lines WL<0:100> may be classified as the redundancy cell arrays 302 and 402.

In this case, an operation of repairing, using a redundancy memory cell, a fail memory cell of the memory cells in the memory cell arrays 301 and 401 of the respective first and second memory apparatuses 3 and 4 may be performed in a word line unit or a bit line unit. For example, as illustrated in FIG. 3A, if each of the redundancy cell arrays 302 and 402 of the respective first and second memory apparatuses 3 and 4 includes the multiple word lines WL<99:100>, a word line of the word lines WL<0:98> in each of the memory cell arrays 301 and 401 of the respective first and second memory apparatuses 3 and 4 and that includes a fail memory cell may be repaired using the word lines WL<99:100> in each of the redundancy cell arrays 302 and 402 of the respective first and second memory apparatuses 3 and 4. Unlike in the example illustrated in the drawing, if each of the redundancy cell arrays 302 and 402 of the respective first and second memory apparatuses 3 and 4 includes multiple bit lines, a bit line that belongs to the multiple bit lines in the memory cell arrays 301 and 401 of the respective first and second memory apparatuses 3 and 4 and that includes a fail memory cell may be repaired using the multiple bit lines in the redundancy cell arrays 302 and 402 of the respective first and second memory apparatuses 3 and 4. For reference, in the following embodiments of the present disclosure, a characteristic configuration and operation of the present disclosure are described based on an operation of performing a repair operation in a word line unit. However, this is merely an example; alternatively, a repair operation may be performed in a bit line unit depending on a designer's choice.

Each of the fuse arrays 32 and 42 of the respective first and second memory apparatuses 3 and 4 may include multiple fuses (not illustrated) operating using the electrical method. A selection word line of the first word lines WL<0:98> in the memory cell arrays 301 and 401 of the respective first and second memory apparatuses 3 and 4 may be replaced with the second word lines WL<99:100> in the redundancy cell arrays 302 and 402 of the respective first and second memory apparatuses 3 and 4. For example, when an address ADDRESS corresponding to a selection word line of the first word lines WL<0:98> is received, the fuse arrays 32 and 42 of the respective first and second memory apparatuses 3 and 4 may output a signal for selecting a second word line WL<99:100> that replaces the selection word line to the memory cell regions 30 and 40 of the respective first and second memory apparatuses 3 and 4. Accordingly, in response to the address ADDRESS, the second word lines WL<99:100> may be selected instead of the selection word line in the first word lines WL<0:98>. When an address ADDRESS corresponding to another word line, not a selection word line, among the first word lines WL<0:98> is input, the fuse arrays 32 and 42 of the respective first and second memory apparatuses 3 and 4 may output the input address ADDRESS to the memory cell regions 30 and 40 of the respective first and second memory apparatuses 3 and 4 without any change. Accordingly, in response to the address ADDRESS, another word line, not the selection word line in the first word lines WL<0:98>, may be selected. That is, the fuse arrays 32 and 42 of the respective first and second memory apparatuses 3 and 4 may determine whether an address corresponding to a selection word line of the first word lines WL<0:98> has been internally ruptured and whether an input address ADDRESS is an address corresponding to the selection word line through an operation of comparing the input address ADDRESS with the ruptured address within the fuse arrays 32 and 42.

Each of the fail determiners 35 and 45 of the respective first and second memory apparatuses 3 and 4 may determine, as a fail word line, a word line that satisfies a first condition during an access operation for the first word lines WL<0:98> in each of the memory cell arrays 301 and 401 of the memory cell regions 30 and 40 of the respective first and second memory apparatuses 3 and 4, but may determine a fail grade of the fail word line based on a second condition.

Specifically, the fail determiners 35 and 45 of the respective first and second memory apparatuses 3 and 4 may determine, as a fail word line, a word line having an error of 1 bit or more during an access operation for the first word lines WL<0:98> in the memory cell arrays 301 and 401 of the memory cell regions 30 and 40 of the respective first and second memory apparatuses 3 and 4. That is, the first condition of the fail determiners 35 and 45 of the respective first and second memory apparatuses 3 and 4 may be whether an error of 1 bit or more has occurred. Furthermore, the fail determiners 35 and 45 of the respective first and second memory apparatuses 3 and 4 may classify, as a first fail grade, a word line that belongs to fail word lines and that has an error of less than N bits. Furthermore, the fail determiners 35 and 45 of the respective first and second memory apparatuses 3 and 4 may classify, as a second fail grade, a word line that belongs to fail word lines and that has an error of the N bits or more and less than M bits. Furthermore, the fail determiners 35 and 45 of the respective first and second memory apparatuses 3 and 4 may classify, as a third fail grade, a word line that belongs to fail word lines and that has an error of M bits or more. In this case, N may be a natural number of 2 or more, and M may be a natural number greater than N. That is, the second condition of the fail determiners 35 and 45 of the respective first and second memory apparatuses 3 and 4 may be how many errors have occurred in a fail word line.

For example, while an access operation is performed on word lines WL<0:10> of the first word lines WL<0:98>, an error of 1 bit may occur in each of word lines WL0, WL3 and WL4, an error of 2 bits may occur in word line WL1, an error of 3 bits may occur in word line WL2, and no error may occur in word lines WL<5:10>. When N is 2 and M is 3, for example, the fail determiners 35 and 45 of the respective first and second memory apparatuses 3 and 4 may determine word lines WL<0:4> as fail word lines and may not make any determination for word lines WL<5:10>. Furthermore, the fail determiners 35 and 45 of the respective first and second memory apparatuses 3 and 4 may classify, as a first fail grade, word lines WL0, WL3 and WL4 of word lines WL<0:4> determined as fail word lines, may classify, as a second fail grade, word line WL1 of word lines WL<0:4>, and may classify, as a third fail grade, word line WL2 of word lines WL<0:4>.

As described above, the fail determiners 35 and 45 of the respective first and second memory apparatuses 3 and 4 may differently classify fail grades of corresponding word lines based on how many errors have occurred in the corresponding word lines on which an access operation will be performed.

In some embodiments, the fail determiners 35 and 45 of the respective first and second memory apparatuses 3 and 4 may use any known suitable error detection method, such as a parity bit, a checksum, or a cyclic redundancy check (CRC), in order to detect an error in an access operation for a word line.

The information storages 34 and 44 of the respective first and second memory apparatuses 3 and 4 may store a physical address of a fail word line determined by the fail determiners 35 and 45 of the respective first and second memory apparatuses 3 and 4, a fail grade of the fail word line, and an access count of the fail word line, as determination information for the fail word line. That is, whenever determining a fail word line, the fail determiners 35 and 45 of the respective first and second memory apparatuses 3 and 4 may store a physical address, fail grade and access count of the determined fail word line in the information storages 34 and 44 of the respective first and second memory apparatuses 3 and 4.

Reference may be further made to FIG. 4 in order to describe a detailed configuration of each of the information storages 34 and 44 of the respective first and second memory apparatuses 3 and 4.

Referring to FIGS. 2A, 2B, 3A and 4 together, the information storages 34 and 44 of the respective first and second memory apparatuses 3 and 4 may store a physical address PHYSICAL ADDRESS for a fail word line determined by the fail determiners 35 and 45 of the respective first and second memory apparatuses 3 and 4. It may be seen that the fail grade GRADE and access count ACCESS COUNT of the fail word line are together in correspondence with the physical address PHYSICAL ADDRESS.

For example, each of the information storages 34 and 44 of the respective first and second memory apparatuses 3 and 4 may include spaces S<1:14> in which the physical addresses PHYSICAL ADDRESS, fail grades GRADE and access counts ACCESS COUNT of 14 fail word lines determined by each of the fail determiners 35 and 45 of the respective first and second memory apparatuses 3 and 4 may be stored. In this case, the three spaces S<1:3> of the 14 spaces S<1:14> may be reserved in each of the information storages 34 and 44 in order to store a fail address classified as a third fail grade GRADE3 by each of the fail determiners 35 and 45. Furthermore, the five spaces S<4:8> may be reserved in each of the information storages 34 and 44 of the respective first and second memory apparatuses 3 and 4 in order to store a fail address classified as a second fail grade GRADE2 by each of the fail determiners 35 and 45 of the respective first and second memory apparatuses 3 and 4. Furthermore, the six spaces S<9:14> may be reserved in each of the information storages 34 and 44 of the respective first and second memory apparatuses 3 and 4 in order to store a fail address classified as a first fail grade GRADE1 by each of the fail determiners 35 and 45 of the respective first and second memory apparatuses 3 and 4.

In such a state, it may be assumed that each of the fail determiners 35 and 45 of the respective first and second memory apparatuses 3 and 4 classifies word lines WL0, WL3 and WL4 as the first fail grade, classifies WL1 as the second fail grade, and classifies WL2 as the third fail grade.

In such a case, an access count value ACCESS_COUNT<2> of word line WL2, together with a physical address ADDRESS<2> thereof, may be stored in the first space S1 among the three spaces S<1:3>, reserved for the third fail grade, in each of the information storages 34 and 44 of the respective first and second memory apparatuses 3 and 4. Furthermore, an access count value ACCESS_COUNT<1> of word line WL1, together with a physical address ADDRESS<1> thereof, may be stored in the first space S4 among the five spaces S<4:8>, reserved for the second fail grade, in each of the information storages 34 and 44. Furthermore, an access count value ACCESS_COUNT<0> of word line WL0, together with a physical address ADDRESS<0> thereof, may be stored in the first space S9 among the six spaces S<9:14>, reserved for the first fail grade, in each of the information storages 34 and 44. An access count value ACCESS_COUNT<3> of word line WL3, together with a physical address ADDRESS<3> thereof, may be stored in the second space S10 among the six spaces S<9:14> of each of the information storages 34 and 44. An access count value ACCESS_COUNT<4> of word line WL4, together with a physical address ADDRESS<4> thereof, may be stored in the third space S11 among the six spaces S<9:14> of each of the information storages 34 and 44.

In the aforementioned description, an access count value of a specific word line may mean the number of times that the specific word line has been accessed at the time at which the physical address PHYSICAL ADDRESS of the specific word line is stored in each of the information storages 34 and 44. For example, each of the first and second memory apparatuses 3 and 4 may include counter logic (not illustrated) for managing the access counts of multiple word lines WL<0:100>, separately from an operation of storing the physical address PHYSICAL ADDRESS of a specific word line in each of the information storages 34 and 44. Accordingly, an access count of a specific word line of the multiple word lines WL<0:100> and that is managed by the counter logic (not illustrated) of each of the first and second memory apparatuses 3 and 4 may be stored in each of the information storages 34 and 44 of the respective first and second memory apparatuses 3 and 4 at the time at which the physical address PHYSICAL ADDRESS of the specific word line is stored. For reference, the counter logic (not illustrated) may be a part of the control logic for decoding a command COMMAND within each of the first and second memory apparatuses 3 and 4 and controlling operations of other internal elements 30, 32, 33, 34 and 35/40, 42, 43, 44 and 45.

Each of the information storages 34 and 44 of the respective first and second memory apparatuses 3 and 4 stores determination information for a fail word line, and may be implemented with a register or a memory device, such as an SRAM or a DRAM, which is separated from each of the memory cell regions 30 and 40 of the respective first and second memory apparatuses 3 and 4. That is, as illustrated in FIG. 2B, the information storages 34 and 44 may be included in the first and second memory apparatuses 3 and 4, respectively, such that each is physically separate from the corresponding memory cell region 30 or 40. Accordingly, determination information for a fail word line determined by the fail determiners 35 and 45 of the respective first and second memory apparatuses 3 and 4, that is, a physical address PHYSICAL ADDRESS, a fail grade GRADE, and an access count value ACCESS COUNT, may be output from the fail determiners 35 and 45 and stored in the information storages 34 and 44.

Unlike the example illustrated in FIG. 2B, the information storages 34 and 44 may be included in the first and second memory apparatuses 3 and 4, respectively, such that each of the information storages 34 and 44 is allocated a region or portion of the corresponding memory cell region 30 or 40.

Referring to FIGS. 2C and 3B together, the memory cell regions 30 and 40 of the first and second memory apparatuses 3 and 4 may include the memory cell arrays 301 and 401, the redundancy cell arrays 302 and 402, and cell regions for the information storages 34 and 44, respectively. That is, memory cells that belong to multiple word lines WL<0:100> in the memory cell regions 30 and 40 of the respective first and second memory apparatuses 3 and 4 and that are included in the first word lines WL<0:96> may be classified as the memory cell arrays 301 and 401, memory cells in the second word lines WL<99:100> of the multiple word lines WL<0:100> may be classified as the redundancy cell arrays 302 and 402, and memory cells in the third word lines WL<97:98> of the multiple word lines WL<0:100> may be classified as a cell region for the information storages 34 and 44. If each of the information storages 34 and 44 has a form included in each of the memory cell regions 30 and 40 as described above, determination information for a fail word line determined by each of the fail determiners 35 and 45 of the respective first and second memory apparatuses 3 and 4, that is, a physical address PHYSICAL ADDRESS, a fail grade GRADE, and an access count value ACCESS COUNT, may be output from each of the fail determiners 35 and 45 and stored in each of the information storages 34 and 44 of the respective memory cell regions 30 and 40.

The rupture operation components 33 and 43 of the respective first and second memory apparatuses 3 and 4 may perform a selection operation of selecting a selection word line from fail word lines, in response to a first control signal CONTROL1 output by the information analyzer 5. Furthermore, the rupture operation components 33 and 43 of the respective first and second memory apparatuses 3 and 4 may perform a rupture operation of rupturing the physical address of a selection word line into the fuse arrays 32 and 42, in response to a second control signal CONTROL2 output by the information analyzer 5.

The information analyzer 5 may analyze determination information stored in the information storages 34 and 44 of the respective first and second memory apparatuses 3 and 4, may generate first and second control signals CONTROL<1:2> based on a result of the analysis, and may transmit the first and second control signals CONTROL<1:2> to the rupture operation components 33 and 43 of the respective first and second memory apparatuses 3 and 4 in the memory system 6.

More specifically, the information analyzer 5 may analyze determination information stored in the information storage 34 of the first memory apparatus 3, that is, a physical address PHYSICAL ADDRESS, fail grade GRADE and access count value ACCESS COUNT of a fail word line determined by the fail determiner 35 of the first memory apparatus 3. Further, the information analyzer 5 may generate first and second control signals CONTROL<1:2> based on a result of the analysis, and may transmit the first and second control signals CONTROL<1:2> to the rupture operation component 33 of the first memory apparatus 3. In response to the first control signal CONTROL1, the rupture operation component 33 of the first memory apparatus 3 may perform a selection operation of selecting a selection word line from fail word lines determined by the fail determiner 35 of the first memory apparatus 3. Furthermore, in response to the second control signal CONTROL2, the rupture operation component 33 of the first memory apparatus 3 may perform a rupture operation of rupturing the physical address of the selection word line into the fuse array 32. That is, in response to the first and second control signals CONTROL<1:2> generated by the information analyzer 5, the rupture operation component 33 of the first memory apparatus 3 may rupture, into the fuse array 32, the physical addresses of only selection word lines determined by the fail determiner 35.

Likewise, the information analyzer 5 may analyze determination information stored in the information storage 44 of the second memory apparatus 4, that is, a physical address PHYSICAL ADDRESS, fail grade GRADE and access count value ACCESS COUNT of a fail word line determined by the fail determiner 45 of the second memory apparatus 4. Further, the information analyzer 5 may generate first and second control signals CONTROL<1:2> based on a result of the analysis, and may transmit the first and second control signals CONTROL<1:2> to the rupture operation component 43 of the second memory apparatus 4. In response to the first control signal CONTROL1, the rupture operation component 43 of the second memory apparatus 4 may perform a selection operation of selecting a selection word line from fail word lines determined by the fail determiner 45 of the second memory apparatus 4. Furthermore, in response to the second control signal CONTROL2, the rupture operation component 43 of the second memory apparatus 4 may perform a rupture operation of rupturing the physical address of the selection word line into the fuse array 42. That is, in response to the first and second control signals CONTROL<1:2> generated by the information analyzer 5, the rupture operation component 43 of the second memory apparatus 4 may rupture, into the fuse array 42, the physical addresses of only selection word lines determined by the fail determiner 45.

The information analyzer 5 may analyze determination information stored in the information storage 34 of the first memory apparatus 3, may generate a first control signal CONTROL1 so that the rupture operation component 33 of the first memory apparatus 3 selects, as a selection word line, a fail word line, of the fail word lines, that corresponds to the first fail grade GRADE1, and that has an access count ACCESS COUNT exceeding a set count, and may transmit the first control signal CONTROL1 to the rupture operation component 33 of the first memory apparatus 3. In contrast, the information analyzer 5 may analyze determination information stored in the information storage 34 of the first memory apparatus 3, may generate a first control signal CONTROL1 so that the rupture operation component 33 of the first memory apparatus 3 does not select, as a selection word line, a fail word line that corresponds to the first fail grade GRADE1, but has an access count ACCESS COUNT of a set count or less, and may transmit the first control signal CONTROL1 to the rupture operation component 33 of the first memory apparatus 3. Furthermore, the information analyzer 5 may analyze determination information stored in the information storage 34 of the first memory apparatus 3, may generate a first control signal CONTROL1 so that the rupture operation component 33 of the first memory apparatus 3 selects, as selection word line, a fail word line, of the fail word lines that corresponds to the second fail grade GRADE2 or the third fail grade GRADE3, and may transmit the first control signal CONTROL1 to the rupture operation component 33 of the first memory apparatus 3.

Likewise, the information analyzer 5 may analyze determination information stored in the information storage 44 of the second memory apparatus 4, may generate a first control signal CONTROL1 so that the rupture operation component 43 of the second memory apparatus 4 selects, as a selection word line, a fail word line, of the fail word lines, that corresponds to the first fail grade GRADE1 and that has an access count ACCESS COUNT exceeding a set count, and may transmit the first control signal CONTROL1 to the rupture operation component 43 of the second memory apparatus 4. In contrast, the information analyzer 5 may analyze determination information stored in the information storage 44 of the second memory apparatus 4, may generate a first control signal CONTROL1 so that the rupture operation component 43 of the second memory apparatus 4 does not select, as a selection word line, a fail word line that corresponds to the first fail grade GRADE1, but has an access count ACCESS COUNT of a set count or less, and may transmit the first control signal CONTROL1 to the rupture operation component 43 of the second memory apparatus 4. Furthermore, the information analyzer 5 may analyze determination information stored in the information storage 44 of the second memory apparatus 4, may generate a first control signal CONTROL1 so that the rupture operation component 43 of the second memory apparatus 3 selects, as a selection word line, a fail word line, of the fail word lines, that corresponds to the second fail grade GRADE2 or the third fail grade GRADE3, and may transmit the first control signal CONTROL1 to the rupture operation component 43 of the second memory apparatus 4.

The rupture operation component 33 of the first memory apparatus 3 may perform a rupture operation of rupturing the physical address of a selection word line into the fuse array 32. However, when access to the first memory apparatus 3 occurs in the time period during which the rupture operation component 33 performs the rupture operation, a normal rupture operation cannot be ensured. The reason for this may be that a very high voltage is used for an operation of rupturing a new physical address into the fuse array 32 because the operation is an operation of changing an electrical connection state of a fuse in the fuse array 32 by applying electrical stress to the fuse. Furthermore, as described above, an address ADDRESS received from the host 7 is transmitted to the memory cell region 30 via the fuse array 32. In this case, the normal operation thereof cannot be ensured because the fuse array 32 cannot operate properly while a new physical address is ruptured into the fuse array 32. As in the fuse array 32 of the first memory apparatus 3, even a normal rupture operation of the rupture operation component 43 cannot be ensured in the fuse array 42 of the second memory apparatus 4 when access to the second memory apparatus 4 occurs while the rupture operation component 43 performs a rupture operation.

Accordingly, the time at which the rupture operation components 33 and 43 of the respective first and second memory apparatuses 3 and 4 perform a rupture operation may be determined based on the following conditions in which the information analyzer 5 generates a second control signal CONTROL2.

According to a first condition, the information analyzer 5 may analyze determination information stored in the information storages 34 and 44 of the respective first and second memory apparatuses 3 and 4. In a selection operation performed by the rupture operation components 33 and 43 in each of at least K memory apparatuses of the first and second memory apparatuses 3 and 4 in response to a first control signal CONTROL1, when the rupture operation components 33 and 43 select, as a selection word line, a fail word line corresponding to the third fail grade GRADE3, the information analyzer 5 may output an urgent rupture signal REQUEST_RUPTURE to the host 7. Thereafter, when a permission response to the urgent rupture signal REQUEST_RUPTURE is received from the host 7, the information analyzer 5 may generate a second control signal CONTROL2 so that the rupture operation components 33 and 43 of the respective first and second memory apparatuses 3 and 4 perform a rupture operation, and may transmit the second control signal CONTROL2 to the rupture operation components 33 and 43 of the respective first and second memory apparatuses 3 and 4. In this case, K may be a natural number or 1 or more.

For example, it may be assumed that the physical address of one fail word line has been stored in the three spaces S<1:3>, reserved for the third fail grade, in the information storage 34 of the first memory apparatus 3 and a fail physical address has not been stored in the three spaces S<1:3>, reserved for the third fail grade, in the information storage 34 of the second memory apparatus 4.

Assuming that K is 1, the information analyzer 5 may output an urgent rupture signal REQUEST_RUPTURE to the host 7 regardless of the number of physical addresses of fail word lines which are stored in the 11 spaces S<4:14>, reserved for the second and first fail grades, in each of the information storage 34 of the first memory apparatus 3 and the information storage 44 of the second memory apparatus 4. Next, when a permission response to the urgent rupture signal REQUEST_RUPTURE is received from the host 7, the information analyzer 5 may generate a second control signal CONTROL2 so that the rupture operation components 33 and 43 of the respective first and second memory apparatuses 3 and 4 perform a rupture operation at the time at which the permission response is received.

In contrast, assuming that K is 2, the information analyzer 5 may not generate an urgent rupture signal REQUEST_RUPTURE because only one physical address of a fail word line determined as the third fail grade is present.

According to a second condition, the information analyzer 5 may analyze determination information stored in the information storages 34 and 44 of the respective first and second memory apparatuses 3 and 4. In a selection operation performed by the rupture operation components 33 and 43 in each of at least K memory apparatuses of the first and second memory apparatuses 3 and 4 in response to a first control signal CONTROL1, when the rupture operation components 33 and 43 select, as a second word line, a fail word line that corresponds to a second fail grade GRADE2 and that has an access count exceeding a set count, the information analyzer 5 may output an urgent rupture signal REQUEST_RUPTURE to the host 7. Thereafter, when a permission response to the urgent rupture signal REQUEST_RUPTURE is received from the host 7, the information analyzer 5 may generate a second control signal CONTROL2 so that the rupture operation components 33 and 43 of the respective first and second memory apparatuses 3 and 4 perform a rupture operation, and may transmit the second control signal CONTROL2 to the rupture operation components 33 and 43 of the respective first and second memory apparatuses 3 and 4. In this case, K may be a natural number of 1 or more.

For example, it may be assumed that in the state in which a fail physical address has not been stored in the three spaces S<1:3>, reserved for the third fail grade, in each of the information storage 34 of the first memory apparatus 3 and the information storage 44 of the second memory apparatus 4, one fail physical address having an access count value ACCESS COUNT exceeding a set count value is present in fail physical addresses stored in the five spaces S<4:8>, reserved for the second fail grade, in the information storage 34 of the first memory apparatus 3, and a fail physical address has not been stored in the five spaces S<4:8>, reserved for the second fail grade, in the information storage 44 of the second memory apparatus 4.

In this case, assuming that K is 1, the information analyzer 5 may output an urgent rupture signal REQUEST_RUPTURE to the host 7, regardless of how many fail physical addresses are stored in the six spaces S<9:14>, reserved for the first fail grade, in each of the information storage 34 of the first memory apparatus 3 and the information storage 44 of the second memory apparatus 4. Thereafter, when a permission response to the urgent rupture signal REQUEST_RUPTURE is received from the host 7, the information analyzer 5 may generate a second control signal CONTROL2 so that the rupture operation components 33 and 43 of the respective first and second memory apparatuses 3 and 4 perform a rupture operation at the time at which the permission response is received.

In contrast, assuming that K is 2, the information analyzer 5 may not generate an urgent rupture signal REQUEST_RUPTURE because one fail physical address that is determined as the second fail grade and that has an access count value ACCESS COUNT exceeding a set count value is present.

According to a third condition, the information analyzer 5 may analyze determination information stored in the information storage 34 and 44 of the respective first and second memory apparatuses 3 and 4. In selection operations performed by both the rupture operation components 33 and 43 of the respective first and second memory apparatuses 3 and 4 in response to a first control signal CONTROL1, when the sum of the number of times that both the rupture operation components 33 and 43 have selected, as a selection word line, a fail word line corresponding to the second fail grade GRADE2 and having an access count of a set count or less and the number of times that both the rupture operation components have selected, as a selection word line, a fail word line corresponding to the first fail grade GRADE1 and having an access count exceeding a set count exceeds a reference number, both the rupture operation components 33 and 43 may output urgent rupture signals REQUEST_RUPTURE to the host 7. Thereafter, when a permission response to the urgent rupture signals REQUEST_RUPTURE is received from the host 7, the information analyzer 5 may generate a second control signal CONTROL2 so that both the rupture operation components 33 and 43 of the respective first and second memory apparatuses 3 and 4 perform rupture operations, and may transmit the second control signal CONTROL2 to the rupture operation components 33 and 43 of the respective first and second memory apparatuses 3 and 4.

For example, it may be assumed that a fail physical address has not been stored in a total of 6 spaces (e.g., S<1:3> of the information storage 34 and S<1:3> of the information storage 44), reserved for the third fail grade, in both the information storages 34 and 44 of the first and second memory apparatuses 3 and 4, and the sum of the number of fail physical addresses, each having an access count value ACCESS COUNT of a set count value or less, among fail physical addresses stored in a total of 10 spaces (e.g., S<4:8> of the information storage 34 and S<4:8> of the information storage 44) reserved for the second fail grade, and the number of fail physical addresses, each having an access count value ACCESS COUNT exceeding a set count value, among fail physical addresses stored in a total of 12 spaces (e.g., S<9:14> of the information storage 34 and S<9:14> of the information storage 44) reserved for the first fail grade, is 8.

In this case, assuming that the reference number is 6, the information analyzer 5 may determine that the sum exceeds the reference number, and may output an urgent rupture signal REQUEST_RUPTURE to the host 7. Thereafter, when a permission response to the urgent rupture signal REQUEST_RUPTURE is received from the host 7, the information analyzer 5 may generate a second control signal CONTROL2 so that each of the rupture operation components 33 and 43 of the respective first and second memory apparatuses 3 and 4 performs a rupture operation at the time at which the permission response is received.

According to a fourth condition, the information analyzer 5 may analyze determination information stored in the information storage units 34 and 44 of the respective first and second memory apparatuses 3 and 4. In selection operations performed by both the rupture operation components 33 and 43 of the respective first and second memory apparatuses 3 and 4 in response to a first control signal CONTROL1, when the sum of the number of times that both the rupture operation components 33 and 43 have selected, as a selection word line, a fail word line corresponding to the second fail grade GRADE2 and having an access count of a set count or less and the number of times that both the rupture operation components 33 and 43 have selected, as a selection word line, a fail word line corresponding to the first fail grade GRADE1 and having an access count exceeding a set count is the reference number or less, the information analyzer 5 may generate a second control signal so that both the rupture operation components 33 and 43 of the respective first and second memory apparatuses 3 and 4 perform rupture operations after entering set time periods, respectively, and may transmit the second control signal to the rupture operation components 33 and 43 of the respective first and second memory apparatuses 3 and 4.

For example, it may be assumed that a fail physical address has not been stored in a total of 6 spaces (e.g., S<1:3> of the information storage 34 and S<1:3> of the information storage 44), reserved for the third fail grade, in both the information storages 34 and 44 of the first and second memory apparatuses 3 and 4, and the sum of the number of fail physical addresses, each having an access count value ACCESS COUNT of a set count value or less, among fail physical addresses stored in a total of 10 spaces (e.g., S<4:8> of the information storage 34 and S<4:8> of the information storage 44) reserved for the second fail grade, and the number of fail physical addresses, each having an access count value ACCESS COUNT exceeding a set count value, among fail physical addresses stored in a total of 12 spaces (e.g., S<9:14> of the information storage 34 and S<9:14> of the information storage 44) reserved for the first fail grade, is 4.

In this case, assuming that a reference number is 6, the information analyzer 5 may determine that the sum is the reference number or less, may not generate an urgent rupture signal REQUEST_RUPTURE, may generate a second control signal so that both the rupture operation components 33 and 43 of the respective first and second memory apparatuses 3 and 4 perform rupture operations after entering set time periods, respectively, and may transmit the second control signal to the rupture operation components 33 and 43 of the respective first and second memory apparatuses 3 and 4.

According to a fifth condition, when a permission response to an urgent rupture signal REQUEST_RUPTURE is not received from the host 7 after the information analyzer 5 outputs the urgent rupture signal REQUEST_RUPTURE to the host 7 in the first to third conditions, the information analyzer 5 may generate a second control signal so that each of the rupture operation components 33 and 43 of the respective first and second memory apparatuses 3 and 4 perform a rupture operation after entering a set time period, and may transmit the second control signal to the rupture operation components 33 and 43 of the respective first and second memory apparatuses 3 and 4.

In this case, the set time period may be the time during which the memory system 6 performs a booting operation. Accordingly, in the fourth and fifth conditions, the operation of each of the rupture operation components 33 and 43 being scheduled to perform the rupture operation after entering the set time period may be an operation of each of the rupture operation components 33 and 43 being scheduled to perform the rupture operation after the memory system 6 starts a booting operation.

In some embodiments, the urgent rupture signal REQUEST_RUPTURE may be a signal to request the holding of access to the first and second memory apparatuses 3 and 4 from the host 7. That is, when the information analyzer 5 generates an urgent rupture signal REQUEST_RUPTURE and transmits it to the host 7, the host 7 may determine whether to hold an access operation for the first and second memory apparatuses 3 and 4. When the host 7 permits the holding of the access operation for the first and second memory apparatuses 3 and 4, the host 7 may transmit a permission response to the information analyzer 5. In contrast, when the host 7 does not permit the holding of the access operation for the first and second memory apparatuses 3 and 4, the host 7 may not transmit a permission response to the information analyzer 5 or may transmit a rejection response.

In some embodiments, the urgent rupture signal REQUEST_RUPTURE may be a signal to request the re-booting of the first and second memory apparatuses 3 and 4 from the host 7. That is, when the information analyzer 5 generates an urgent rupture signal REQUEST_RUPTURE and transmits it to the host 7, the host 7 may determine whether to re-boot the first and second memory apparatuses 3 and 4. When the host 7 permits the re-booting of the first and second memory apparatuses 3 and 4, the host 7 may transmit a permission response to the information analyzer 5. In contrast, when the host 7 does not permit the re-booting of the first and second memory apparatuses 3 and 4, the host 7 may not transmit a permission response to the information analyzer 5 or may transmit a rejection response.

In this case, when the host 7 permits the holding of an access operation for or the re-booting of the first and second memory apparatuses 3 and 4, this may mean that the host 7 does not use the first and second memory apparatuses 3 and 4 for a moment, that is, during the time when access to the first and second memory apparatuses 3 and 4 is held or the time taken for the first and second memory apparatuses 3 and 4 to be re-booted.

In some embodiments, how the information analyzer 5 transmits the urgent rupture signal REQUEST_RUPTURE to the host 7 and how the host 7 transmits the permission response or rejection response to the information analyzer 5 may be performed by a method predefined by a designer between the host 7 and the memory system 6. For example, the urgent rupture signal REQUEST_RUPTURE may be transmitted to the host 7 along with a signal indicative of a result of a command operation, that is, an execution success or an execution failure, after the first and second memory apparatuses 3 and 4 perform the command operation in response to a command COMMAND received from the host 7. Furthermore, the permission response or rejection response transmitted from the host 7 to the information analyzer 5 may be transmitted to the information analyzer 5 in the form of a command COMMAND.

In the second embodiment of the present disclosure as described above, when detecting whether a fail word line is present and corresponding information is stored in the information storages 34 and 44 of the respective multiple semiconductor memory apparatuses 3 and 4, the fail determiners 35 and 45 of the respective multiple semiconductor memory apparatuses 3 and 4 may determine and store a fail grade GRADE of the fail word line. In this case, the information analyzer 5 may analyze determination information stored in the information storages 34 and 44 of the respective multiple semiconductor memory apparatuses 3 and 4 and may prevent a fail word line, having a low fail grade GRADE, from being selected as a selection word line by the rupture operation component s 33 and 43 of the respective multiple semiconductor memory apparatuses 3 and 4. Accordingly, a repair operation may be prevented from being too frequently performed in the multiple semiconductor memory apparatuses 3 and 4.

In some embodiments, the information analyzer 5 may analyze determination information stored in the information storages 34 and 44 of the respective multiple semiconductor memory apparatuses 3 and 4. If a fail word line having a very high fail grade GRADE is present based on a result of the analysis, the information analyzer 5 may generate an urgent rupture signal REQUEST_RUPTURE and may output the urgent rupture signal to the host 7 in order to perform a repair operation as soon as possible. Accordingly, a probability that an error may occur due to an access operation for a fail word line having a very high fail grade GRADE may be minimized.

The memory device according to embodiments of the present disclosure can autonomously detect a fail word line, determine a grade of the fail word line by analyzing a result of the detection, and determine whether a repair operation is necessary based on the determined grade. Accordingly, performing a repair operation too frequently can be prevented.

Furthermore, the time at which a repair operation is performed may be adjusted based on the number of errors in and grade of a fail word line for which the repair operation is necessary. Accordingly, a probability that an access error may occur due to a delayed repair operation may be minimized.

Figure 5:
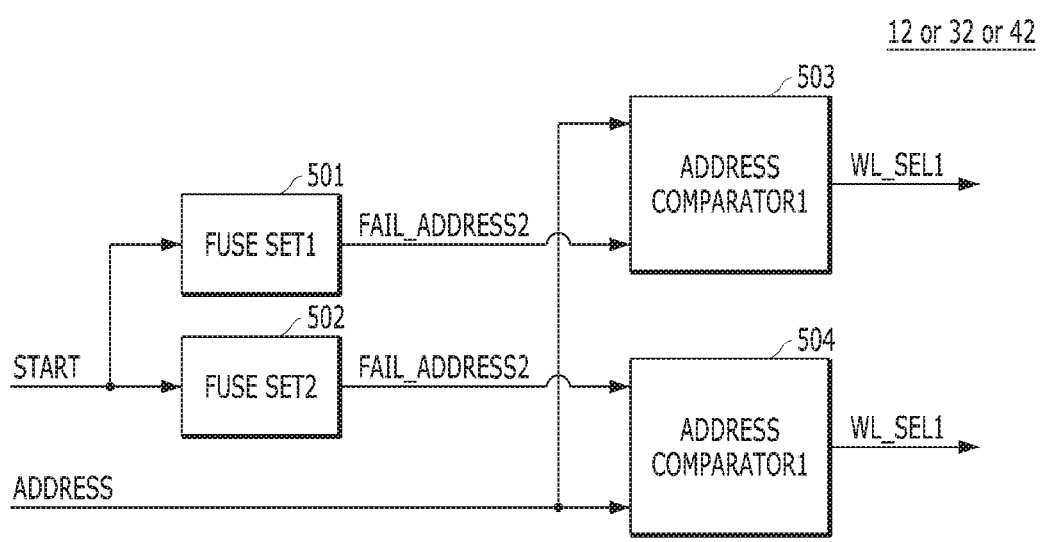
FIG. 5 illustrates a detailed structure of a fuse array included in the semiconductor memory devices in accordance with the first and second embodiments of the present invention described above with reference to FIGS. 1A and 1B and FIGS. 2A to 2C.

FIG. 5 illustrates a detailed structure of a fuse array included in the semiconductor memory devices in accordance with the first and second embodiments of the present invention described above with reference to FIGS. 1A and 1B and FIGS. 2A to 2C.

Referring to FIG. 5, the fuse array 12 or 32 or 42 may include a plurality of fuse sets 501 and 502 and a plurality of address comparators 503 and 504.

To be specific, when the address ADDRESS input from the outside of the semiconductor memory device 1 or 3 or 4 corresponds to the selection word line, the fuse array 12 or 32 or 42 may output signals WL_SEL<1:2> for selecting a second word line WL<99:100> that replaces the selection word line to the memory cell region 10 or 30 or 40.

In each of the plurality of fuse sets 501 and 502 included in the fuse array 12 or 32 or 42, the physical address of the selection word line may be ruptured. In other words, each of the plurality of fuse sets 501 and 502 included in the fuse array 12 or 32 or 42 may store the physical address of the selection word line through a rupture operation of the rupture operation component 13 or 33 or 43. Also, each of the plurality of fuse sets 501 and 502 may output the physical address of a selection word line stored therein in response to a start signal START. In this case, the start signal START may be a signal that is temporarily activated whenever the address ADDRESS is input from the outside of the semiconductor memory device 1 or 3 or 4.

Also, the plurality of address comparators 503 and 504 included in the fuse array 12 or 32 or 42 may determine whether or not the address ADDRESS input from the outside of the semiconductor memory device 1 or 3 or 4 have the same value as the physical address of the selection word line output from each of the plurality of fuse sets 501 and 502, and may output a signal WL_SEL<1:2> for selecting the second word line WL<99:100> that replaces the selection word line to the memory cell region 10 or 30 or based on the determination result.

For example, it may be assumed that the address ADDRESS input from the outside of the semiconductor memory device 1 or 3 or 4 has the same value as the selection address stored in the first fuse set 501. In this case, the first address comparator 503 may detect that the address ADDRESS input from the outside of the semiconductor memory device 1 or 3 or 4 has the same value as the selection address stored in the first fuse set 501, and may activate the signal WL_SEL1 for selecting the first word line WL<99> among the second word lines WL<99:100> and output it to the memory cell region 10 or 30 or 40. In this case, the second address comparator 504 may detect that the address ADDRESS input from the outside of the semiconductor memory device 1 or 3 or 4 does not have the same value as the selection address stored in the second fuse set 502, and may deactivate the signal WL_SEL2 for selecting the second word line WL<100> among the second word lines WL<99:100> and output it to the memory cell region 10 or 30 or 40.

In the memory cell region 10 or 30 or 40, in response to the signal WL_SEL1 for selecting the first word line WL<99> input from the first address comparator 503 being activated and the signal WL_SEL2 for selecting the second word line WL<100> input from the second address comparator 504 being deactivated, the first word line WL<99> may be selected instead of the selection word line corresponding to the address ADDRESS input from the outside.

Herein, the rupture operation may represent an operation performed to store data in a plurality of fuses (not shown) included in the fuse array 12 or 32 or 42 and operating in an electrical method. For example, a fuse that operates in the electrical method may store data by destroying/not destroying the gate oxide of a transistor forming the fuse ('0' may be stored before the destruction, and '1' may be stored after the destruction). Herein, an operation of changing the value stored in the fuse by applying a control signal having a high voltage difference to both ends of the fuse and destroying the gate oxide of the transistor forming the fuse may be referred to as a rupture operation.

Although various embodiments have been illustrated and described, it will be apparent to those skilled in the art that various changes and modifications may be made without departing from the spirit and scope of the invention as defined in the following claims.

The present invention encompasses all such changes and modifications that fall within the scope of the claims.

What is claimed is:

1. A memory apparatus comprising:
    a cell array comprising multiple first word lines each including multiple first memory cells and multiple second word lines each including multiple second memory cells;
    a fuse array configured to replace a selection word line of the multiple first word lines with one of the multiple second word lines;
    a fail determiner, coupled to the cell array, configured to determine, as fail word lines, word lines each of which satisfy a first condition during an access operation for the multiple first word lines and to determine a fail grade of each of the fail word lines based on a second condition;
    an information storage configured to store a physical address, fail grade and access count of each of the fail word lines as determination information for the corresponding fail word line; and
    a rupture operation component, coupled to between the fuse array and the information storage, configured to analyze the determination information, select the selection word line from the fail word lines based on a result of the analysis, and perform a rupture operation of rupturing a physical address of the selection word line into the fuse array.

2. The memory apparatus of claim 1, wherein the fail determiner is configured to:
    determine, as the fail word lines, word lines each having an error of 1 bit or more during the access operation for the multiple first word lines,
    classify, as a first fail grade, a word line having an error of less than N bits among the fail word lines,
    classify, as a second fail grade, a word line having an error of the N bits or more and less than M bits among the fail word lines, and
    classify, as a third fail grade, a word line having an error of the M bits or more among the fail word lines,
    wherein N is a natural number of 2 or more and M is a natural number greater than N.

3. The memory apparatus of claim 2, wherein the rupture operation component is configured to:
    analyze the determination information, and
    select, as the selection word line, one of the fail word line of the first fail grade and having an access count exceeding a set count and the fail word lines of the second and third fail grades.

4. The memory apparatus of claim 3, wherein the rupture operation component is configured to:
    analyze the determination information,
    output an urgent rupture signal when the number of fail word lines of the third fail grade is one or more or the number of fail word lines of the second fail grade and having the access count exceeding the set count is one or more, and
    perform the rupture operation when a permission response to the urgent rupture signal is received.

5. The memory apparatus of claim 4, wherein the rupture operation component is configured to:
    analyze the determination information,
    output an urgent rupture signal when a sum of the number of fail word lines of the second fail grade and having an access count of the set count or less and the number of fail word lines of the first fail grade and having an access count exceeding the set count exceeds a reference number, and
    perform the rupture operation when a permission response to the urgent rupture signal is received.

6. The memory apparatus of claim 5, wherein the rupture operation component is configured to:
analyze the determination information, and
be scheduled to perform the rupture operation after entering a set time period, when the sum is the reference number or less, or when a permission response to the urgent rupture signal is not received after outputting an urgent rupture signal.

7. The memory apparatus of claim 6, wherein the urgent rupture signal requests holding access to the memory apparatus.

8. The memory apparatus of claim 6, wherein the urgent rupture signal requests re-booting of the memory apparatus.

9. The memory apparatus of claim 6, wherein the set time period is a time during a booting operation is performed.

10. The memory apparatus of claim 1, wherein:
the cell array comprises multiple third memory cells, and
the information storage is configured to store the addresses of the fail word lines in the multiple third memory cells.

11. A memory system comprising:
multiple memory apparatuses coupled to each other, and
an information analyzer coupled to each of the multiple memory apparatuses,
each of the multiple memory apparatuses comprises:
a cell array comprising multiple first word lines each including multiple first memory cells and multiple second word lines each including multiple second memory cells;
a fuse array configured to replace a selection word line of the multiple first word lines with one of the multiple second word lines;
a fail determiner, coupled to the cell array, configured to determine, as fail word lines, word lines, each of which satisfy a first condition, during an access operation for the multiple first word lines and to determine a fail grade of each of the fail word lines based on a second condition;
an information storage configured to store a physical address, fail grade and access count of each of the fail word line as determination information for the corresponding fail word line; and
a rupture operation component, coupled to between the fuse array and the information storage, configured to perform a selection operation of selecting the selection word line from the fail word lines in response to a first control signal of the information analyzer and perform a rupture operation of rupturing a physical address of the selection word line into the fuse array in response to a second control signal of the information analyzer,
wherein the information analyzer is configured to analyze the determination information stored in the information storage of each of the multiple memory apparatuses and to generate the first and second control signals based on a result of the analysis.

12. The memory system of claim 11, wherein the fail determiner is configured to:
determine, as the fail word lines, word lines having an error of 1 bit or more during the access operation for the multiple first word lines,
classify, as a first fail grade, a word line having an error of less than N bits among the fail word lines,
classify, as a second fail grade, a word line having an error of the N bits or more and less than M bits among the fail word lines, and
classify, as a third fail grade, a word line having an error of the M bits or more among the fail word lines,
wherein N is a natural number of 2 or more and M is a natural number greater than N.

13. The memory system of claim 12, wherein the information analyzer is configured to:
analyze the determination information stored in the information storage of each of the multiple memory apparatuses, and
generate the first control signal so that the rupture operation component in each of the multiple memory apparatuses performs the selection operation of selecting, as the selection word line, one of the fail word line of the first fail grade and having an access count exceeding a set count and the fail word lines of the second and third fail grades.

14. The memory system of claim 13, wherein the information analyzer is configured to:
in the selection operation performed by the rupture operation component, included in each of at least K memory apparatuses of the multiple memory apparatuses, in response to the first control signal, when the fail word line of the third fail grade is selected as the selection word line or when the fail word line of the second fail grade and having an access count exceeding the set count is selected as the selection word line,
output an urgent rupture signal to a host, and
generate the second control signal so that the rupture operation component, included in each of the multiple memory apparatuses, performs the rupture operation when a permission response to the urgent rupture signal is received from the host,
wherein K is a natural number of 2 or more.

15. The memory system of claim 14, wherein the information analyzer is configured to:
in the selection operations performed by all the rupture operation components in the multiple memory apparatuses in response to the first control signal, when a sum of the number of times that the rupture operation components have selected, as the selection word line, the fail word line of the second fail grade and having an access count of the set count or less and the number of times that the rupture operation components have selected, as the selection word line, the fail word line of the first fail grade and having an access count exceeding the set count exceeds a reference number,
output an urgent rupture signal to the host, and
generate the second control signal so that the rupture operation component in each of the multiple memory apparatuses performs the rupture operation when a permission response to the urgent rupture signal is received from the host.

16. The memory system of claim 15, wherein the information analyzer is configured to:
generate the second control signal so that the rupture operation component in each of the multiple memory apparatuses performs the rupture operation after entering a set time period, when the sum is the reference number or less or when a permission response to an urgent rupture signal is not received from the host after outputting the urgent rupture signal to the host.

17. The memory system of claim 16, wherein the urgent rupture signal comprises a signal to request holding access to the multiple memory apparatuses from the host.

18. The memory system of claim 16, wherein the urgent rupture signal requests a re-booting of the multiple memory apparatuses from the host.

19. The memory system of claim 16, wherein the set time period is a time during which a booting operation is performed.

20. The memory system of claim 11, wherein:
the cell array comprises multiple third memory cells, and
the information storage is configured to store the addresses of the fail word lines in the multiple third memory cells.

* * * * *